(12) United States Patent
Madsen et al.

(10) Patent No.: US 8,614,899 B2
(45) Date of Patent: Dec. 24, 2013

(54) FIELD BARRIER STRUCTURES WITHIN A CONFORMAL SHIELD

(75) Inventors: Ulrik Riis Madsen, Herning (DK); Lars Sandahl Ubbesen, Aalborg (DK)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 13/415,643

(22) Filed: Mar. 8, 2012

(65) Prior Publication Data

US 2012/0170239 A1 Jul. 5, 2012

Related U.S. Application Data

(62) Division of application No. 11/952,484, filed on Dec. 7, 2007, now abandoned.

(60) Provisional application No. 60/946,453, filed on Jun. 27, 2007, provisional application No. 60/978,006, filed on Oct. 5, 2007.

(51) Int. Cl.
*H05K 1/18* (2006.01)

(52) U.S. Cl.
USPC .............................. 361/777; 257/659; 438/112

(58) Field of Classification Search
CPC ........................................................ H05K 1/18
USPC ........................................................ 361/777
See application file for complete search history.

(56) References Cited

U.S. PATENT DOCUMENTS

| | | |
|---|---|---|
| 3,566,190 A | 2/1971 | Huebner et al. |
| 5,436,203 A | 7/1975 | Lin |
| 3,907,616 A | 9/1975 | Wiemer |
| 3,907,617 A | 9/1975 | Zwernemann |
| 4,680,676 A | 7/1987 | Petratos et al. |
| 5,389,738 A | 2/1995 | Piosenka et al. |

(Continued)

FOREIGN PATENT DOCUMENTS

| | | |
|---|---|---|
| CN | 1855451 A | 11/2006 |
| EP | 1715520 A1 | 10/2006 |

(Continued)

OTHER PUBLICATIONS

Notice of Allowance for U.S. Appl. No. 13/187,814 mailed Sep. 10, 2012, 8 pages.

(Continued)

*Primary Examiner* — Walter H Swanson
(74) *Attorney, Agent, or Firm* — Withrow & Terranova, P.L.L.C.

(57) ABSTRACT

In one embodiment, a meta-module having circuitry for two or more modules is formed on a substrate, which is preferably a laminated substrate. The circuitry for the different modules is initially formed on the single meta-module. Each module will have one or more component areas in which the circuitry is formed. A metallic structure is formed on or in the substrate for each component area to be shielded. A single body, such as an overmold body, is then formed over all of the modules on the meta-module. At least a portion of the metallic structure for each component area to be shielded is then exposed through the body by a cutting, drilling, or like operation. Next, an electromagnetic shield material is applied to the exterior surface of the body of each of the component areas to be shielded and in contact with the exposed portion of the metallic structures.

9 Claims, 39 Drawing Sheets

(56) References Cited

U.S. PATENT DOCUMENTS

| | | | |
|---|---|---|---|
| 5,406,630 A | 4/1995 | Piosenka et al. | |
| 5,459,368 A | 10/1995 | Onishi et al. | |
| 5,473,512 A | 12/1995 | Degani et al. | |
| 5,639,989 A | 6/1997 | Higgins, III | |
| 5,646,828 A | 7/1997 | Degani et al. | |
| 5,650,659 A | 7/1997 | Mostafazadeh et al. | |
| 5,977,626 A | 11/1999 | Wang et al. | |
| 6,004,180 A | 12/1999 | Knall et al. | |
| 6,011,698 A | 1/2000 | Buehler | |
| 6,137,693 A | 10/2000 | Schwiebert et al. | |
| 6,150,193 A | 11/2000 | Glenn | |
| 6,163,454 A | 12/2000 | Strickler | |
| 6,297,957 B1 | 10/2001 | Johnson et al. | |
| 6,448,583 B1 | 9/2002 | Yoneda et al. | |
| 6,448,793 B1 | 9/2002 | Barratt et al. | |
| 6,466,416 B1 | 10/2002 | Honjo et al. | |
| 6,538,196 B1 | 3/2003 | MacDonald et al. | |
| 6,590,152 B1 | 7/2003 | Horio et al. | |
| 6,599,779 B2 | 7/2003 | Shim et al. | |
| 6,613,660 B2 | 9/2003 | Kahlert et al. | |
| 6,633,073 B2 | 10/2003 | Rezvani et al. | |
| 6,657,592 B2 | 12/2003 | Dening et al. | |
| 6,707,168 B1 | 3/2004 | Hoffman et al. | |
| 6,717,485 B2 | 4/2004 | Kolb et al. | |
| 6,791,795 B2 | 9/2004 | Ohtomo et al. | |
| 6,807,731 B2 | 10/2004 | Brandenburg et al. | |
| 6,825,560 B1 | 11/2004 | Walker et al. | |
| 6,838,750 B2 | 1/2005 | Nuytkens et al. | |
| 6,887,787 B2 | 5/2005 | Farnworth | |
| 6,946,324 B1 | 9/2005 | McLellan et al. | |
| 6,998,532 B2 | 2/2006 | Kawamoto et al. | |
| 7,030,469 B2 | 4/2006 | Mahadevan et al. | |
| 7,042,398 B2 | 5/2006 | Tang et al. | |
| 7,087,461 B2 | 8/2006 | Park et al. | |
| 7,087,462 B1 | 8/2006 | Park et al. | |
| 7,109,817 B2 | 9/2006 | Kolb et al. | |
| 7,125,744 B2 | 10/2006 | Takehara et al. | |
| 7,148,574 B2 | 12/2006 | Lee et al. | |
| 7,187,060 B2 | 3/2007 | Usui | |
| 7,227,719 B2 | 6/2007 | Sasaki et al. | |
| 7,259,041 B2 | 8/2007 | Stelzl et al. | |
| 7,342,303 B1 | 3/2008 | Berry et al. | |
| 7,348,663 B1 | 3/2008 | Kirloskar et al. | |
| 7,433,203 B1 | 10/2008 | Yi et al. | |
| 7,443,693 B2 | 10/2008 | Arnold et al. | |
| 7,445,968 B2 | 11/2008 | Harrison et al. | |
| 7,451,539 B2 | 11/2008 | Morris et al. | |
| 7,478,474 B2 | 1/2009 | Koga | |
| 7,488,903 B2 | 2/2009 | Kawagishi et al. | |
| 7,514,772 B2 | 4/2009 | Kobayashi et al. | |
| 7,548,430 B1 | 6/2009 | Huemoeller et al. | |
| 7,598,606 B2 | 10/2009 | Chow et al. | |
| 7,633,170 B2 | 12/2009 | Yang et al. | |
| 7,633,765 B1 | 12/2009 | Scanlan et al. | |
| 7,635,918 B2 | 12/2009 | Yoshida | |
| 7,636,245 B2 * | 12/2009 | Clancy et al. | 361/816 |
| 7,643,311 B2 | 1/2010 | Coffy | |
| 7,651,889 B2 | 1/2010 | Tang et al. | |
| 7,665,201 B2 | 2/2010 | Sjoedin | |
| 7,671,451 B2 | 3/2010 | Lee et al. | |
| 7,700,411 B2 | 4/2010 | Yang et al. | |
| 7,772,046 B2 | 8/2010 | Pagaila et al. | |
| 7,829,981 B2 | 11/2010 | Hsu | |
| 7,902,643 B2 | 3/2011 | Tuttle | |
| 7,928,538 B2 | 4/2011 | Salzman | |
| 8,013,258 B2 | 9/2011 | Wu | |
| 8,093,690 B2 | 1/2012 | Ko et al. | |
| 8,220,145 B2 | 7/2012 | Hiner et al. | |
| 8,373,264 B2 | 2/2013 | Welch et al. | |
| 8,434,220 B2 | 5/2013 | Rao et al. | |
| 2002/0036345 A1 | 3/2002 | Iseki et al. | |
| 2002/0118529 A1 | 8/2002 | Babin et al. | |
| 2003/0011049 A1 | 1/2003 | Nuytkens et al. | |
| 2003/0048581 A1 | 3/2003 | Ohtomo et al. | |
| 2003/0062541 A1 | 4/2003 | Warner | |
| 2003/0151122 A1 | 8/2003 | Davies | |
| 2004/0063246 A1 | 4/2004 | Karnezos | |
| 2004/0103509 A1 | 6/2004 | Bidard et al. | |
| 2004/0104473 A1 | 6/2004 | Farnworth | |
| 2004/0178500 A1 | 9/2004 | Usui | |
| 2004/0209434 A1 | 10/2004 | Seaford et al. | |
| 2004/0214023 A1 | 10/2004 | Park et al. | |
| 2004/0222511 A1 | 11/2004 | Zhang | |
| 2004/0232536 A1 | 11/2004 | Fukuzumi | |
| 2004/0238934 A1 | 12/2004 | Warner et al. | |
| 2005/0046001 A1 | 3/2005 | Warner | |
| 2005/0153061 A1 | 7/2005 | Nuytkens et al. | |
| 2006/0033184 A1 | 2/2006 | Park et al. | |
| 2006/0151203 A1 | 7/2006 | Krueger et al. | |
| 2006/0223577 A1 | 10/2006 | Ouzillou | |
| 2006/0244131 A1 | 11/2006 | Kobayashi et al. | |
| 2006/0273813 A1 | 12/2006 | Coffy | |
| 2006/0274517 A1 | 12/2006 | Coffy | |
| 2007/0030661 A1 | 2/2007 | Morris et al. | |
| 2007/0042593 A1 | 2/2007 | Lee et al. | |
| 2007/0045248 A1 | 3/2007 | Schein et al. | |
| 2007/0058748 A1 | 3/2007 | Kim et al. | |
| 2007/0062637 A1 | 3/2007 | Sjoedin | |
| 2007/0155053 A1 | 7/2007 | Karnezos | |
| 2007/0163802 A1 | 7/2007 | Monthei | |
| 2007/0200210 A1 | 8/2007 | Zhao et al. | |
| 2007/0222697 A1 | 9/2007 | Caimi et al. | |
| 2007/0290322 A1 | 12/2007 | Zhao et al. | |
| 2008/0019112 A1 | 1/2008 | Hatanaka et al. | |
| 2008/0054421 A1 | 3/2008 | Dimaano et al. | |
| 2008/0108179 A1 | 5/2008 | Mistry et al. | |
| 2008/0112151 A1 | 5/2008 | Thompson et al. | |
| 2008/0142938 A1 | 6/2008 | Chow et al. | |
| 2008/0157316 A1 | 7/2008 | Yang et al. | |
| 2008/0210462 A1 | 9/2008 | Kawagishi et al. | |
| 2008/0224306 A1 | 9/2008 | Yang | |
| 2008/0308912 A1 | 12/2008 | Cha et al. | |
| 2008/0317188 A1 | 12/2008 | Staszewski et al. | |
| 2009/0000114 A1 | 1/2009 | Rao et al. | |
| 2009/0000815 A1 | 1/2009 | Hiner et al. | |
| 2009/0000816 A1 | 1/2009 | Hiner et al. | |
| 2009/0002969 A1 | 1/2009 | Madsen et al. | |
| 2009/0002970 A1 | 1/2009 | Leahy et al. | |
| 2009/0002971 A1 | 1/2009 | Carey et al. | |
| 2009/0002972 A1 | 1/2009 | Carey et al. | |
| 2009/0016039 A1 * | 1/2009 | Imamura | 361/818 |
| 2009/0025211 A1 | 1/2009 | Hiner et al. | |
| 2009/0051011 A1 | 2/2009 | Usami | |
| 2009/0066588 A1 | 3/2009 | Cheng et al. | |
| 2009/0072357 A1 | 3/2009 | Tang et al. | |
| 2009/0072364 A1 | 3/2009 | Punzalan et al. | |
| 2009/0079041 A1 | 3/2009 | Huang et al. | |
| 2009/0140402 A1 | 6/2009 | Ohtani | |
| 2009/0227273 A1 | 9/2009 | McCune, Jr. | |
| 2009/0233562 A1 | 9/2009 | Kim et al. | |
| 2009/0270054 A1 | 10/2009 | Ridgers et al. | |
| 2009/0302438 A1 | 12/2009 | Chauhan et al. | |
| 2010/0199492 A1 | 8/2010 | Hiner et al. | |
| 2010/0279730 A1 | 11/2010 | Ortiz | |
| 2011/0014880 A1 | 1/2011 | Nicolson et al. | |
| 2011/0017263 A1 | 1/2011 | Gibson et al. | |
| 2011/0038136 A1 | 2/2011 | Carey et al. | |
| 2011/0225803 A1 | 9/2011 | Hiner et al. | |
| 2011/0235282 A1 | 9/2011 | Leahy et al. | |
| 2011/0298109 A1 | 12/2011 | Pagaila et al. | |
| 2011/0298670 A1 | 12/2011 | Jung et al. | |
| 2012/0074538 A1 | 3/2012 | Tsai et al. | |
| 2012/0270371 A1 | 10/2012 | Debar et al. | |

FOREIGN PATENT DOCUMENTS

| | | |
|---|---|---|
| EP | 1717857 A2 | 11/2006 |
| EP | 1764834 B1 | 3/2007 |
| JP | 11163583 A | 6/1999 |
| JP | 2004207352 A | 7/2004 |
| JP | 2005039007 A | 2/2005 |
| JP | 2005109306 A | 4/2005 |
| JP | 2006332255 A | 12/2006 |
| JP | 2007311396 A | 11/2007 |

(56) References Cited

FOREIGN PATENT DOCUMENTS

| KR | 20060113412 A | 11/2006 |
|---|---|---|
| WO | 0035085 A1 | 6/2000 |
| WO | 03058812 A1 | 7/2003 |
| WO | 2004019490 A1 | 3/2004 |
| WO | 2004060034 A1 | 7/2004 |
| WO | 2007060784 A1 | 5/2007 |
| WO | 2007132560 A1 | 11/2007 |
| WO | 2009144960 A1 | 12/2009 |
| WO | 2010021262 A1 | 2/2010 |

OTHER PUBLICATIONS

Notice of Allowance for U.S. Appl. No. 11/199,319 mailed Oct. 2, 2008, 6 pages, now US Patent No. 7,451,539.
Final Office Action for U.S. Appl. No. 13/117,284 mailed Feb. 29, 2012, 8 pages.
Final Office Action for U.S. Appl. No. 11/435,913 mailed Nov. 17, 2009, 8 pages, now US Patent No. 8,062,930.
Non-final Office Action for U.S. Appl. No. 11/435,913 mailed Mar. 2, 2009, 8 pages, now US Patent No. 8,062,930.
Final Office Action for U.S. Appl. No. 11/435,913 mailed Aug. 15, 2008, 8 pages, now US Patent No. 8,062,930.
Non-final Office Action for U.S. Appl. No. 11/435,913 mailed Jan. 7, 2008, 6 pages, now US Patent No. 8,062,930.
Non-final Office for U.S. Appl. No. 11/768,014 mailed Mar. 25, 2010, 9 pages.
Non-final Office for U.S. Appl. No. 11/768,014 mailed Jul. 10, 2009, 6 pages.
Non-final Office Action for U.S. Appl. No. 11/768,014 mailed Jan. 21, 2009, 9 pages.
Non-final Office Action for U.S. Appl. No. 11/952,484 mailed Oct. 27, 2011, 22 pages.
Final Office Action for U.S. Appl. No. 11/952,484 mailed Oct. 5, 2010, 18 pages.
Non-final Office Action for U.S. Appl. No. 11/952,484 mailed Jan. 8, 2010, 16 pages.
Final Office Action for U.S. Appl. No. 11/952,513 mailed Oct. 26, 2011, 16 pages.
Non-final Office Action for U.S. Appl. No. 11/952,513 mailed May 10, 2011, 19 pages.
Non-final Office Action for U.S. Appl. No. 13/117,284 mailed Nov. 9, 2011, 12 pages.
Non-final Office Action for U.S. Appl. No. 11/952,545 mailed Oct. 23, 2009, 12 pages.
Non-final Office Action for U.S. Appl. No. 11/952,592 mailed Sep. 19, 2011, 9 pages.
Final Office Action for U.S. Appl. No. 11/952,592 mailed Feb. 24, 2011, 10 pages.
Non-final Office Action for U.S. Appl. No. 11/952,592 mailed Dec. 15, 2010, 9 pages.
Final Office Action for U.S. Appl. No. 11/952,592 mailed Apr. 16, 2010, 8 pages.
Non-final Office Action for U.S. Appl. No. 11/952,592 mailed Jul. 28, 2009, 7 pages.
Non-final Office Action for U.S. Appl. No. 11/952,617 mailed Jul. 28, 2011, 9 pages.
Final Office Action for U.S. Appl. No. 11/952,617 mailed Nov. 20, 2009, 16 pages.
Non-final Office Action for U.S. Appl. No. 11/952,617 mailed Sep. 26, 2008, 10 pages.
Non-final Office Action for U.S. Appl. No. 11/952,634 mailed Jun. 13, 2011, 7 pages.
Notice of Allowance for U.S. Appl. No. 11/952,634 mailed Mar. 3, 2011, 3 pages.
Final Office Action for U.S. Appl. No. 11/952,634 mailed Feb. 1, 2011, 7 pages.
Final Office Action for U.S. Appl. No. 11/952,634 mailed Dec. 23, 2010, 9 pages.
Non-final Office Action for U.S. Appl. No. 11/952,634 mailed Jul. 21, 2010, 6 pages.
Office Action for Chinese patent application 200880104171.1 mailed Jun. 2, 2011, 20 pages.
Non-final Office Action for U.S. Appl. No. 11/952,670 mailed Jun. 22, 2011, 4 pages.
Non-final Office Action for U.S. Appl. No. 11/952,670 mailed May 27, 2010, 6 pages.
Notice of Allowance for U.S. Appl. No. 11/952,670 mailed Oct. 21, 2009, 5 pages.
Notice of Allowance for U.S. Appl. No. 11/952,690 mailed Oct. 12, 2010, 4 pages.
Notice of Allowance for U.S. Appl. No. 11/952,690 mailed Sep. 27, 2010, 4 pages.
Notice of Allowance for U.S. Appl. No. 11/952,690 mailed Aug. 30, 2010, 7 pages.
Non-final Office Action for U.S. Appl. No. 11/952,690 mailed Mar. 25, 2010, 8 pages.
Chomerics, "Cho-Shield Conductive Coatings," Last modified Dec. 8, 2000, Chomerics, A Division of Parker Hannifin Corporation. http://www.chomerics.com/products/choshield_coatings.htm, 3 pages.
International Search Report for PCT/US2008/068153 mailed Dec. 9, 2008, 3 pages.
RF Micro Devices, "Fractional-N RF Synthesizer with Modulator and Digital IF Filter," 2005, 2 pages.
Final Office Action for U.S. Appl. No. 11/952,592 mailed Jan. 18, 2012, 10 pages.
Non-Final Rejection for U.S. Appl. No. 12/913,364 mailed Feb. 13, 2012, 32 pages.
Final rejection for U.S. Appl. No. 11/952,617 mailed Feb. 16, 2012, 15 pages.
Notice of Allowance for U.S. Appl. No. 11/952,513 mailed Mar. 6, 2012, 16 pages.
Second Office Action for Chinese patent application 200880104171.1 mailed Feb. 16, 2012, 8 pages.
Non-final Office Action for U.S. Appl. No. 11/435,913, mailed May 21, 2010, 5 pages, now US Patent No. 8,062,930.
Notice of Allowance for U.S. Appl. No. 13/117,284 mailed May 1, 2012, 15 pages.
Non-final Office Action for U.S. Appl. No. 11/952,592 mailed Jun. 12, 2012, 28 pages.
Notice of Allowance for U.S. Appl. No. 11/952,617 mailed Jun. 4, 2012, 24 pages.
Notice of Allowance for U.S. Appl. No. 12/913,364 mailed Jun. 8, 2012, 12 pages.
Non-final Office Action for U.S. Appl. No. 12/766,347 mailed Jun. 29, 2012, 11 pages.
Notice of Allowance for U.S. Appl. No. 11/952,592 mailed Aug. 6, 2012, 7 pages.
Notice of Allowance for U.S. Appl. No. 11/952,670 mailed Aug. 24, 2012, 7 pages.
Final Office Action for U.S. Appl. No. 13/034,787, mailed Mar. 19, 2013, 9 pages.
Final Office Action for U.S. Appl. No. 12/797,381, mailed May 16, 2013, 19 pages.
Advisory Action for U.S. Appl. No. 13/034,787, mailed May 17, 2013, 3 pages.
Notice of Allowance for U.S. Appl. No. 11/952,617 mailed Jan. 8, 2013, 8 pages.
Non-final Office Action for U.S. Appl. No. 13/034,787 mailed Jan. 16, 2013, 9 pages.
Non-final Office Action for U.S. Appl. No. 12/797,381 mailed Jan. 8, 2013, 20 pages.
Non-Final Office Action for U.S. Appl. No. 13/034,755, mailed Aug. 15, 2013, 6 pages.
Non-Final Office Action for U.S. Appl. No. 13/034,787, mailed Aug. 9, 2013, 9 pages.
Advisory Action for U.S. Appl. No. 12/797,381, mailed Jul. 17, 2013, 3 pages.
Restriction Requirement for U.S. Appl. No. 131151,499, mailed Nov. 5, 2013, 8 pages.

\* cited by examiner

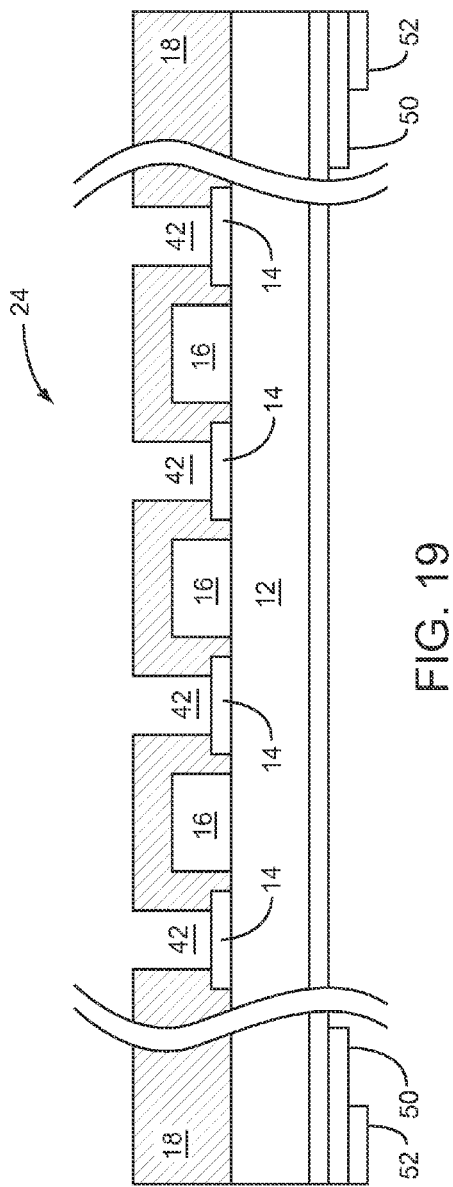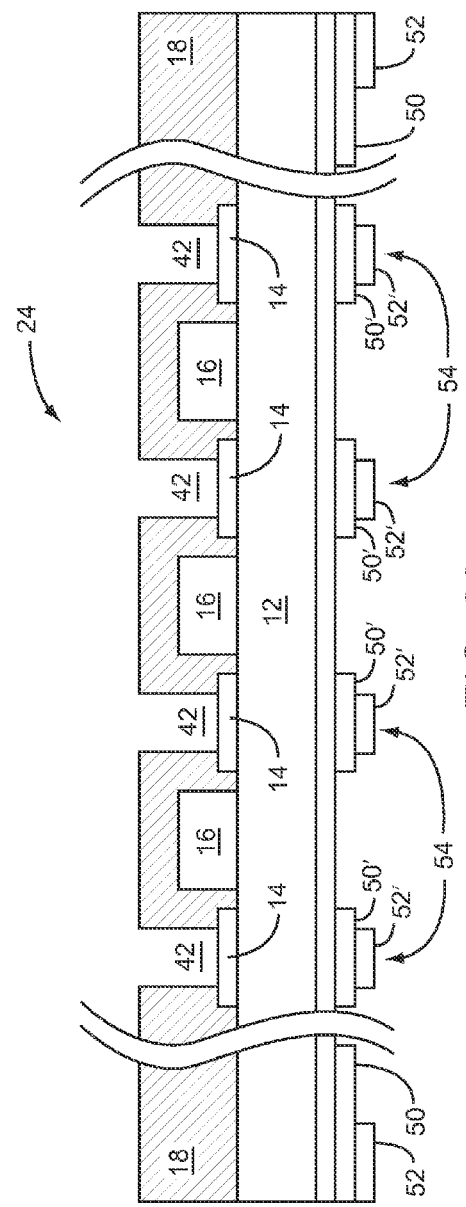

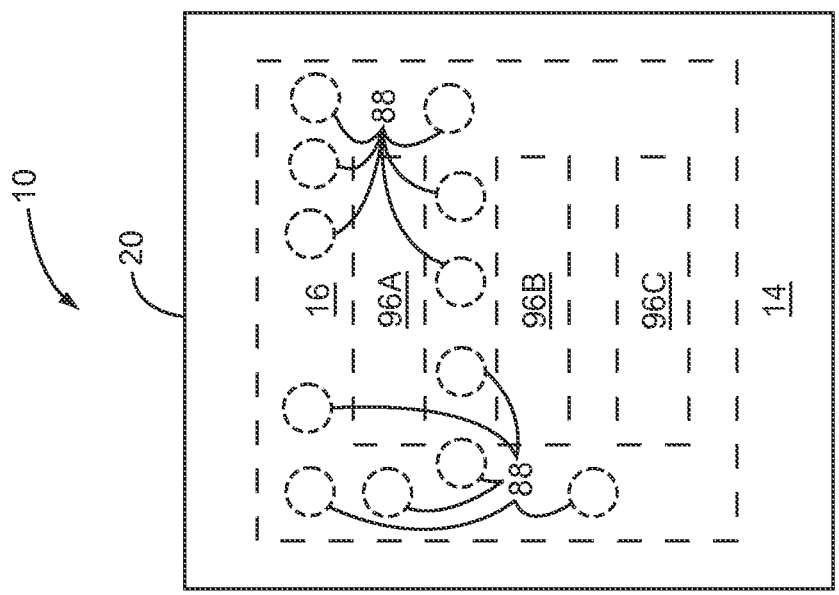
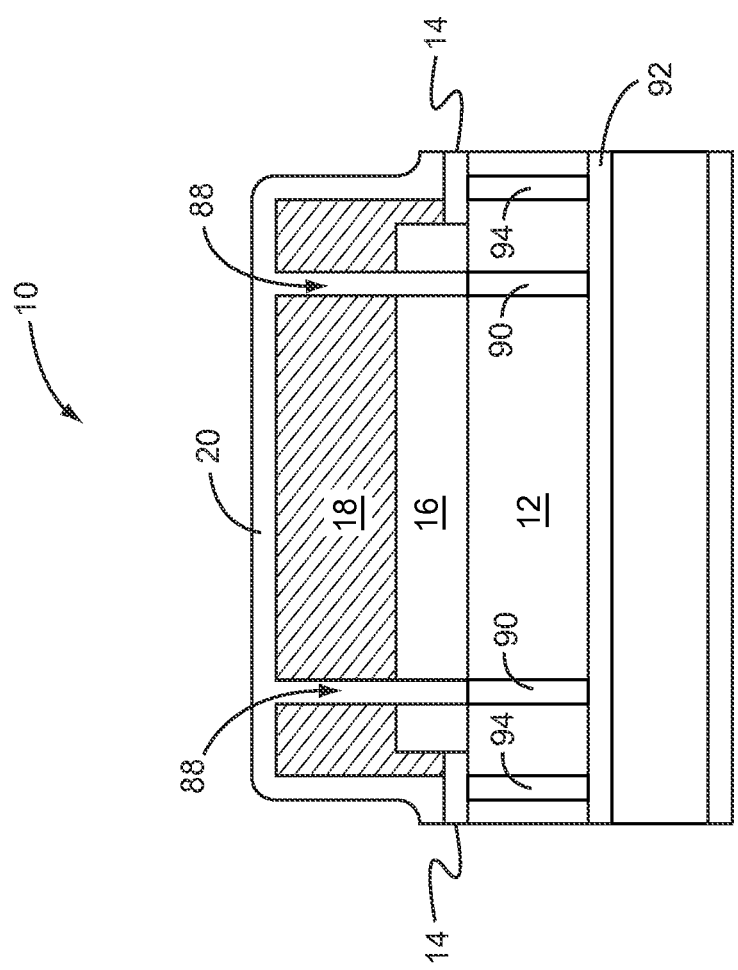

FIELD BARRIER STRUCTURES WITHIN A CONFORMAL SHIELD

This application is a divisional application of U.S. patent application Ser. No. 11/952,484 filed Dec. 7, 2007 which claims the benefit of U.S. provisional patent applications 60/946,453 filed Jun. 27, 2007 and 60/978,006 filed Oct. 5, 2007, the disclosures of which are incorporated herein by reference in their entireties.

CROSS-REFERENCE TO RELATED APPLICATIONS

This application is related to U.S. utility patent application Ser. No. 11/199,319 filed Aug. 8, 2005 and U.S. utility patent application Ser. No. 11/435,913 filed May 17, 2006, the disclosures of which are incorporated herein by reference in their entireties. This application is also related to the following U.S. patent applications: application Ser. No. 11/952,513 filed Dec. 7, 2007; application Ser. No. 11/952,545 filed Dec. 7, 2007; application Ser. No. 11/952,592 filed Dec. 7, 2007; application Ser. No. 11/952,617 filed Dec. 7, 2007; application Ser. No. 11/952,634 filed Dec. 7, 2007; application Ser. No. 11/952,670 filed Dec. 7, 2007; and application Ser. No. 11/952,690 filed Dec. 7, 2007, the disclosures of which are incorporated herein by reference in their entireties.

FIELD OF THE INVENTION

The present invention relates to providing shielding for semiconductor modules, wherein the shielding is integrated with the semiconductor modules.

BACKGROUND OF THE INVENTION

Electronic components have become ubiquitous in modern society. The electronics industry routinely announces accelerated clocking speeds, higher transmission frequencies, and smaller integrated circuit modules. While the benefits of these devices are myriad, smaller electronic components that operate at higher frequencies also create problems. Higher operating frequencies mean shorter wavelengths, where shorter conductive elements within electronic circuitry may act as antennas to unintentionally broadcast electromagnetic emissions throughout the electromagnetic spectrum. If the signal strengths of the emissions are high enough, the emissions may interfere with the operation of an electronic component subjected to the emissions. Further, the Federal Communications Commission (FCC) and other regulatory agencies regulate these emissions, and as such, these emissions must be kept within regulatory requirements.

One way to reduce emissions is to form a shield around the modules that either cause emissions or are sensitive to emissions. Typically, a shield is formed from a grounded conductive structure that covers a module or a portion thereof. When emissions from electronic components within the shield strike the interior surface of the shield, the electromagnetic emissions are electrically shorted through the grounded conductive material that forms the shield, thereby reducing emissions. Likewise, when external emissions from outside the shield strike the exterior surface of the shield, a similar electrical short occurs, and the electronic components on the module do not experience the emissions.

However, as modules continue to become smaller from miniaturization, creating effective shields that do not materially add to the size of the module becomes more difficult. Thus, there is a need for a shield that is inexpensive to manufacture on a large scale, does not substantially change the size of the module, and effectively deals with interference caused by unwanted electromagnetic emissions.

SUMMARY OF THE INVENTION

The present invention may be used to form one or more shields for corresponding component areas of a given module. In one embodiment, a meta-module having circuitry for two or more modules is formed on a substrate, which is preferably a laminated substrate. As such, the circuitry for the different modules is initially formed on the single meta-module. Each module will have one or more component areas in which the circuitry is formed. A metallic structure is formed on or in the substrate for each component area to be shielded on the substrate. In one embodiment, each metallic structure extends about all or a portion of the periphery of each of the component areas to be shielded. A single body, such as an overmold body, is then formed over all of the modules on the meta-module. After the body is formed, at least a portion of the metallic structure for each component area to be shielded is exposed through the body by a cutting, drilling, or like operation. Next, an electromagnetic shield material is applied to the exterior surface of the body of each of the component areas to be shielded and in contact with the exposed portion of the metallic structures. The modules are then singulated from each other to form separate modules, each of which having one or more integrally shielded component areas.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

FIG. 19 illustrates a meta-module without support structures underneath openings that are cut through an overmold body according to one embodiment of the present invention.

FIG. 20 illustrates a meta-module with support structures underneath openings that are cut through an overmold body according to one embodiment of the present invention.

FIGS. 30A and 30B are cross-sectional and top views, respectively, of a module that includes field barrier structures associated with the integrated electromagnetic shield according to one embodiment of the present invention.

DETAILED DESCRIPTION OF THE PREFERRED EMBODIMENTS

Figure 1A:
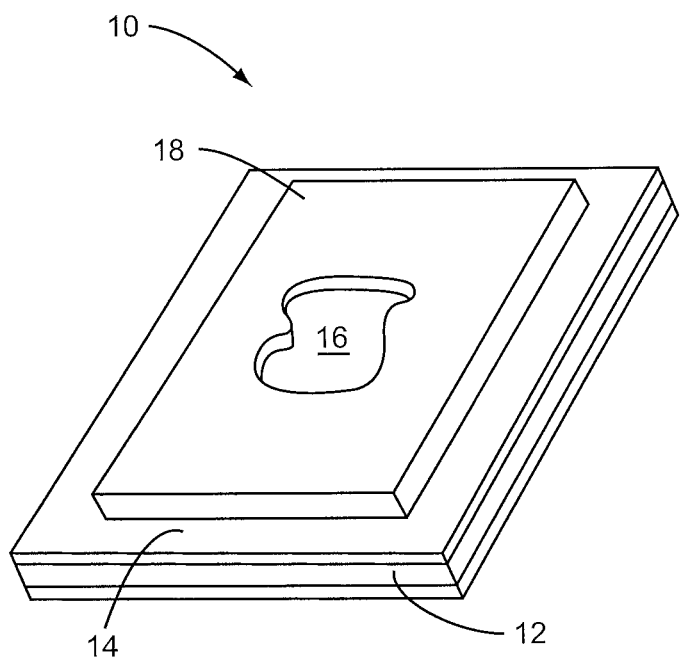
FIG. 1A illustrates a module having one sub-module, which is covered by an overmold body according to an example of the present invention.

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention may be used to form one or more shields for corresponding component areas of a given module. In one embodiment, a meta-module having circuitry for two or more modules is formed on a substrate, which is preferably a laminated substrate. As such, the circuitry for the different modules is initially formed on the single meta-module. Each module will have one or more component areas in which the circuitry is formed. A metallic structure is formed on or in the substrate for each component area to be shielded on the substrate. The metallic structure may be formed from traces, vias, metallic layers, metallic components, plating materials, or the like, as well as any combination thereof. In one embodiment, each metallic structure extends about all or a portion of the periphery of each of the component areas to be shielded. A single body, such as an overmold body, is then formed over all of the modules on the meta-module. After the body is formed, at least a portion of the metallic structure for each component area to be shielded is exposed through the body by a cutting, drilling, or like operation. Next, an electromagnetic shield material is applied to the exterior surface of the body of each of the component areas to be shielded and in contact with the exposed portion of the metallic structures. The modules are then singulated from each other to form separate modules, each of which having one or more integrally shielded component areas.

In one embodiment, the electromagnetic shield material is provided using an electroless plating process, which deposits a conductive seed layer on the overmold body and in contact with the exposed portions of the metallic structures. Then, an electrolytic plating process is used to deposit a second conductive layer onto the seed layer. A final layer of a metallic material, such as nickel, is then deposited on top of the second conductive layer through an electrolytic plating process. In another embodiment, the electromagnetic shield is provided by applying a conductive epoxy or paint to the body and in contact with the exposed portion of the metallic structures. In both embodiments, the conductive layers create an integrated electromagnetic shield for one or more component areas of a module to reduce electromagnetic interference (EMI).

For the following description, the preferred embodiments of the present invention are described. The scope of the invention and the claims that follow shall not be limited to these preferred embodiments. For example, the metallic structure in the preferred embodiments is formed in whole or in part from a metallic layer grid that resides on or in the surface of the substrate. Further, the metallic structure resides along all or a portion of the periphery of one or more component areas. These embodiments lend themselves to efficient processing; however, those skilled in the art will recognize that the metallic structure to which the integrated electromagnetic shield is connected need not reside along the periphery of the component area, or be part of a metallic layer grid. Importantly, the metallic structure may take virtually any form or shape, and may reside on or in the top surface of the substrate. The metallic structure may merely be a single point along the top surface of the module, as well as a continuous or segmented structure that extends along all or a portion of the one or more component areas to be shielded. Accordingly, the metallic layer grid used in the following embodiments to provide a metallic structure is merely provided to illustrate the preferred embodiments, and as such, shall not limit what constitutes a metallic structure or how a metallic structure is formed according to the present invention.

Figure 1B:
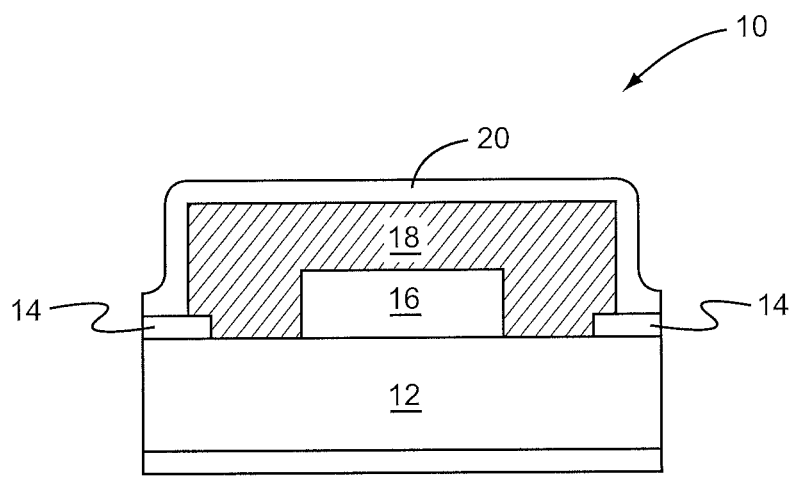
FIG. 1B illustrates a cross-section of the module of FIG. 1A in which an integrated electromagnetic shield is provided according to one embodiment of the present invention.

A module 10 is illustrated in FIGS. 1A and 1B according to one embodiment of the present invention. The module 10 has a laminate 12, which has a metallic structure that may be formed from a metallic layer grid 14 on or in a top surface of the laminate 12 or like substrate. As indicated above, any metallic structure may be used; however, the preferred embodiment uses a portion of the metallic layer grid 14 to form a peripheral metallic structure. Only one section of the metallic layer grid 14 is depicted in these figures and the peripheral metallic structure is not separately labeled, as it is formed from the metallic layer grid 14. The illustrated module 10 has a single component area 16 that lies within the peripheral metallic structure and in which circuitry for the module 10 is formed. A body, such as an overmold body 18, which is formed from a dielectric material, resides over the laminate 12 and encompasses the component area 16. As depicted in FIG. 1B, an electromagnetic shield 20 is integrally formed over the overmold body 18 and in contact with the exposed portions of the peripheral metallic structure of the metallic layer grid 14.

Figure 2A:
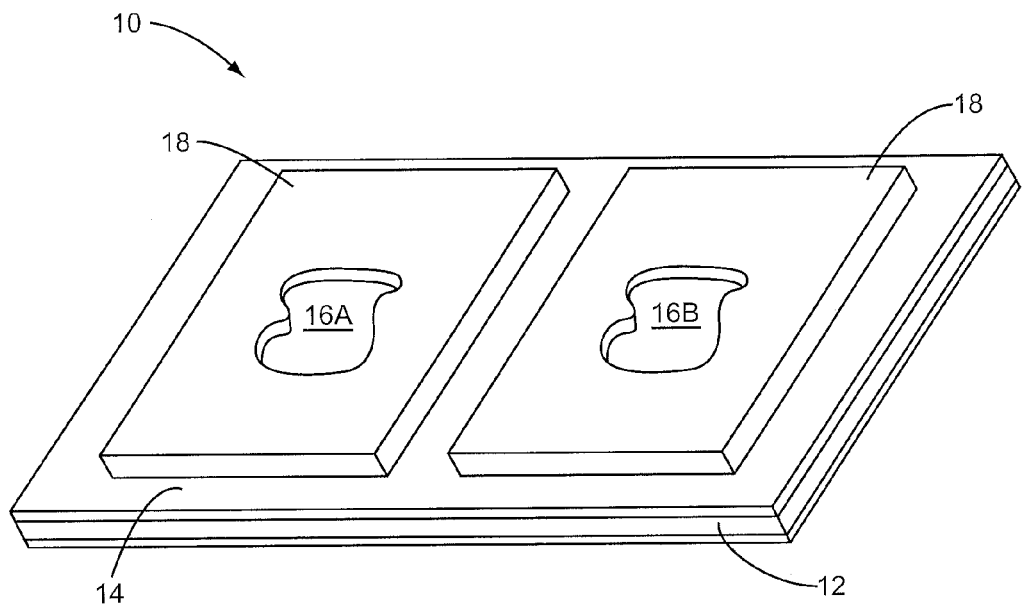
FIG. 2A illustrates a module having two sub-modules, which are covered by an overmold body according to an example of the present invention.
Figure 2B:
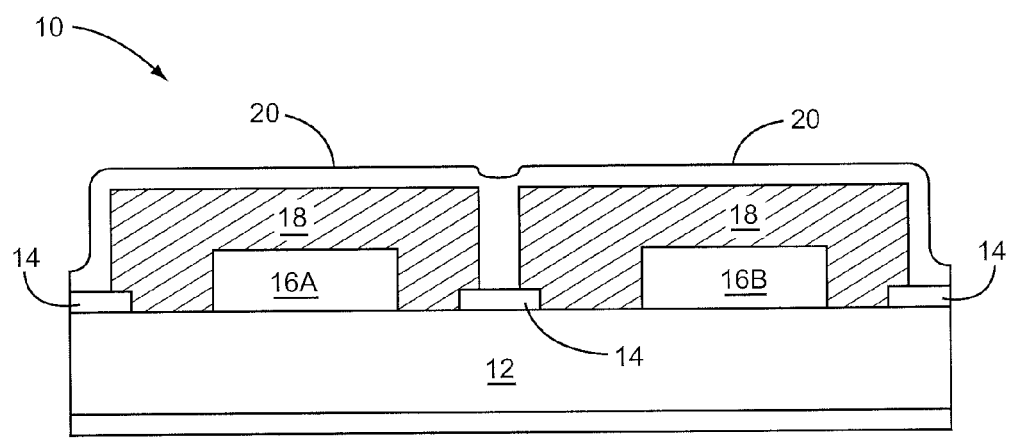
FIG. 2B illustrates a cross-section of the module of FIG. 2A in which an integrated electromagnetic shield is provided according to one embodiment of the present invention.

A given module 10 may include any number of component areas 16 where one or more of the component area 16 has a corresponding electromagnetic shield 20. As illustrated in FIGS. 2A and 2B, two component areas 16A and 16B are positioned in the metallic layer grid 14 such that a peripheral metallic structure is provided for each of the component areas 16A and 16B. In certain instances, peripheral metallic structures for adjacent component areas 16A and 16B may share a common section of the metallic layer grid 14.

The illustrated module 10 has two component areas 16A and 16B, which lie within corresponding peripheral metallic structures and in which circuitry (not illustrated) for the module 10 is formed. Overmold bodies 18 reside over the laminate 12 and encompass the respective component areas 16A and 16B. As depicted in FIG. 2B, electromagnetic shields 20 are integrally formed over the overmold bodies 18 and in contact with the exposed portions of the respective peripheral metallic structures of the metallic layer grid 14. Although the component areas 16A and 16B of module 10 are illustrated as being adjacent one another, they may be substantially separated from one another, as will be described further below.

Figure 3A:
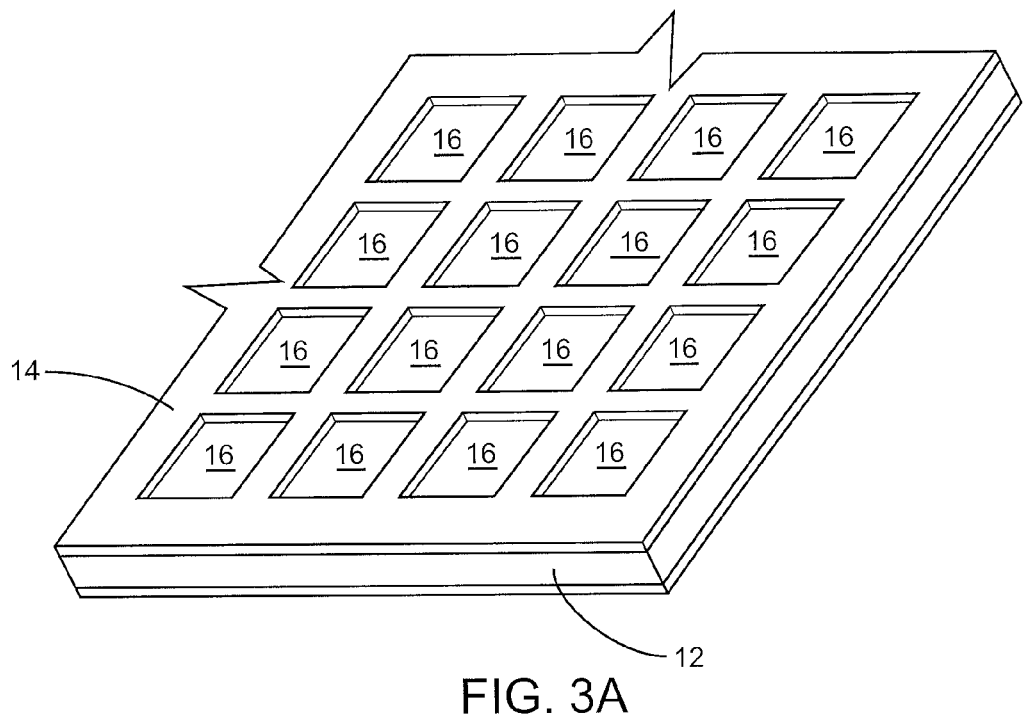
FIG. 3A illustrates a laminate structure having several electronic sub-module components according to the embodiment illustrated in FIGS. 1A and 1B.
Figure 3B:
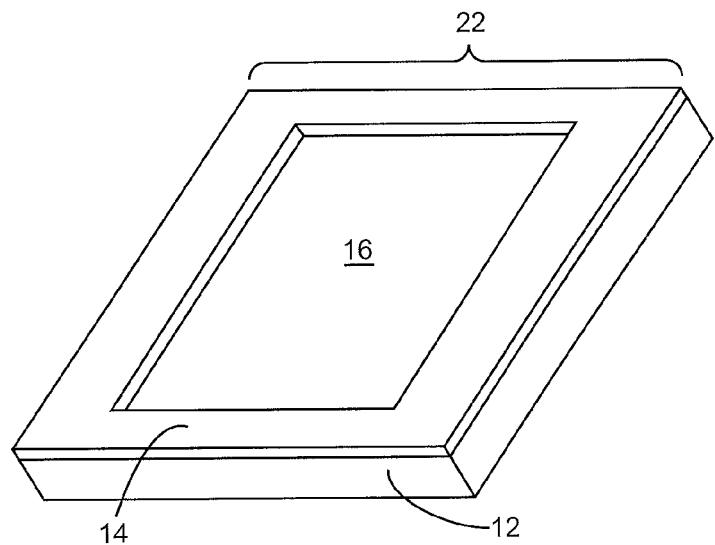
FIG. 3B illustrates a sub-module having a component area positioned on a laminate with an exposed metallic layer grid according to the embodiment illustrated in FIG. 3A.

With reference to FIG. 3A, an extended laminate structure is illustrated wherein a metallic layer grid 14 is formed on or in the top surface of the laminate 12. The laminate structure includes numerous component areas 16, each of which includes the circuitry for a unique module 10, such as that depicted in FIGS. 1A and 1B where each module 10 includes a single component area 16. The illustrated metallic layer grid 14 formed on the laminate structure is a crosshatch of metal traces, which have a defined width. Each opening of the metallic layer grid 14 forms a component area 16 in which circuitry of a module 10 is formed. FIG. 3B illustrates an isolated portion of the laminate structure that will ultimately be used to form a module 10 having a single component area 16, which is associated with a single sub-module 22. In this example, a continuous metal trace is formed about the periphery of each component area 16 and represents the peripheral metallic structure for the corresponding component area 16. The peripheral metallic structure or the metallic layer grid 14 from which it is formed does not need to be continuous or completely or even substantially surround the component area 16 as is illustrated further below. As used herein, the term "peripheral" is defined to be the outermost part or region within a precise boundary, in particular, the boundary formed by the peripheral edge of a component area 16. Notably, this peripheral edge for a module 10 having a single component area 16 resides around the peripheral edge of the module 10. Further, the term "grid" is used merely to indicate that a repeating pattern of metallic structures, peripheral or otherwise, is formed on the meta-module 24 because of the presence of numerous modules. Sections of the metallic layer grid that are associated with different modules 10 or component areas 16 therein may be separate from each other.

Figure 4A:
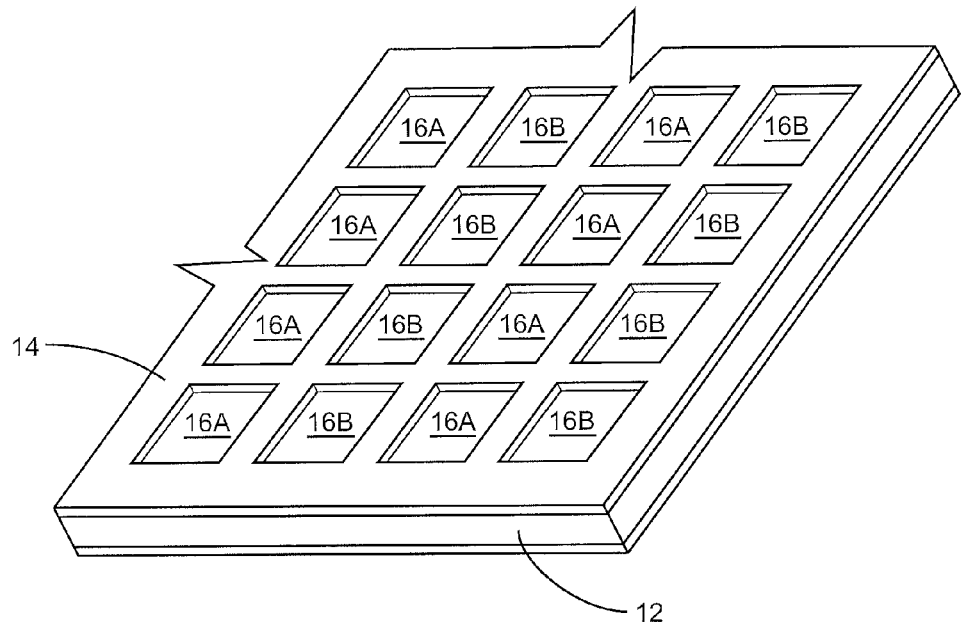
FIG. 4A illustrates a laminate structure having several electronic sub-module component areas according to the embodiment illustrated in FIGS. 2A and 2B.
Figure 4B:
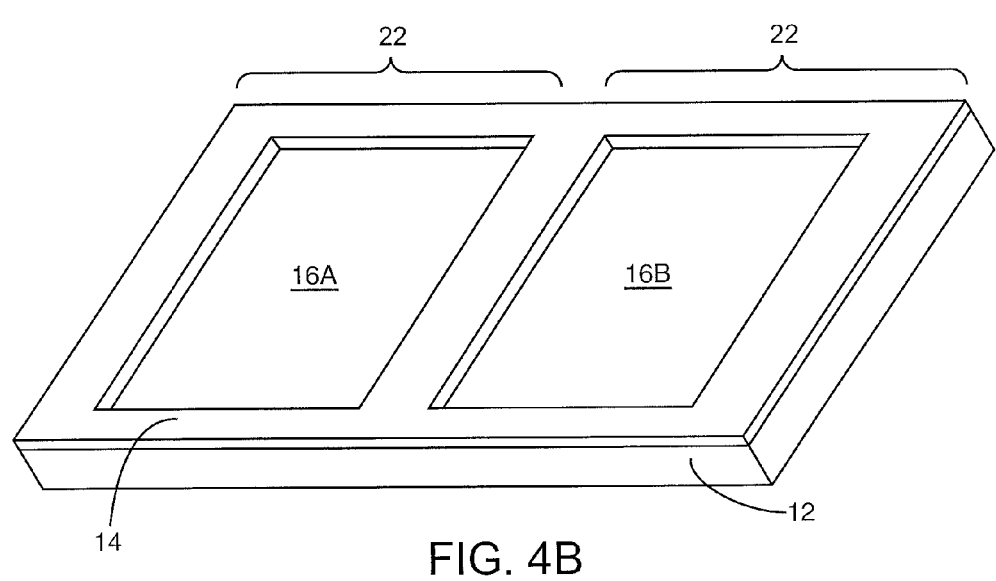
FIG. 4B illustrates a sub-module having a component area positioned on a laminate within an exposed metallic layer grid according to the embodiment illustrated in FIG. 4A.

With reference to FIG. 4A, another extended laminate structure is illustrated wherein a metallic layer grid 14 is formed on the top surface of the laminate 12. The laminate structure includes numerous component areas 16A and 16B. Each pair of component areas 16A and 16B includes the circuitry (not illustrated) for a unique module 10, such as that depicted in FIGS. 2A and 2B where each module 10 includes both component areas 16A and 16B. Each opening of the metallic layer grid 14 forms either a component area 16A or a component area 16B in which circuitry of a module 10 is formed. FIG. 4B illustrates an isolated portion of the laminate structure that will ultimately be used to form a module 10 having two component areas 16A and 16B, which are respectively associated with two sub-modules 22. In this example, a continuous metal trace of the metallic layer grid 14 is formed about the periphery of each component area 16A or 16B and represents the peripheral metallic structure for the corresponding component areas 16A and 16B. Again, the peripheral metallic structure or the metallic layer grid 14 from which it is formed does not need to be continuous or completely surround the component areas 16A or 16B.

Figure 5:
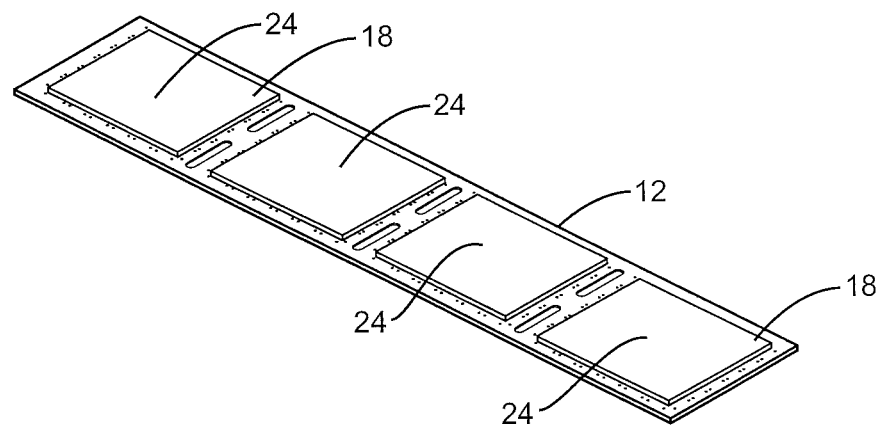
FIG. 5 illustrates a strip of meta-modules according to one embodiment of the present invention.
Figure 6:
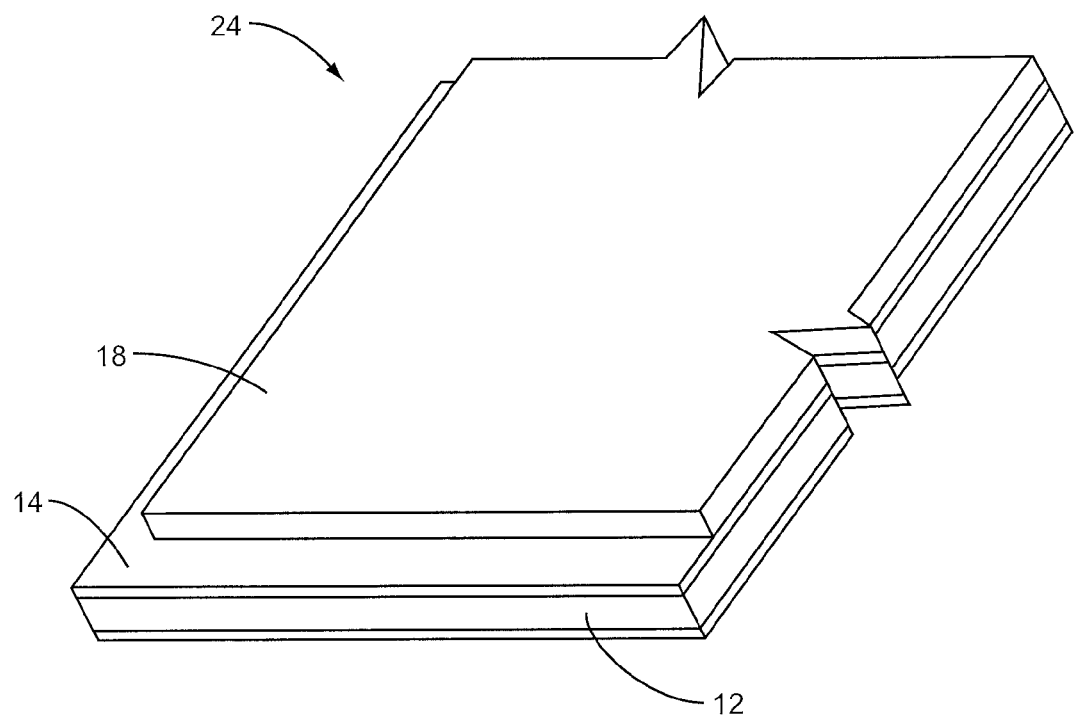
FIG. 6 is a sectional view of a meta-module according to one embodiment of the present invention.

FIG. 5 illustrates four meta-modules 24 on an extended strip of laminate 12. Each meta-module 24 includes a metallic layer grid 14 and component areas 16 (16A,16B) for numerous modules 10. An extended overmold body 18 covers most of each meta-module 24, the metallic layer grid 14, and the component areas 16 therein. The overmold body 18 may be a plastic dielectric material or the like, as is conventionally used for overmolding in semiconductor fabrication processes. Again, other materials and processes may be used to form a body providing a similar protective encapsulation as that provided by an overmold process. As such, each meta-module 24 will ultimately be used to create numerous modules 10, where each module 10 may have one or more component areas 16 that correspond to sub-modules 22 depending on design requirements. A cross-section of a meta-module 24 is illustrated in FIG. 6.

Figure 7:
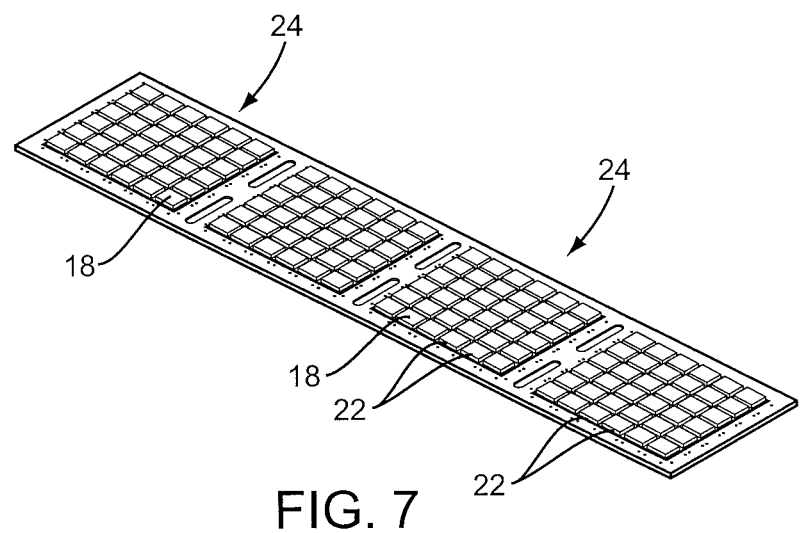
FIG. 7 illustrates the strip of meta-modules of FIG. 5 after a cutting or drilling operation is provided to expose portions of the peripheral metallic structure about each component area according to one embodiment of the present invention.

As illustrated, each component area 16 to be shielded for all of the modules 10 on the meta-module 24 may have a peripheral metallic structure, which is part of the metallic layer grid 14. After the single overmold body 18 is formed over all of the modules 10 on the meta-module 24, at least a portion of the peripheral metallic structure for each component area 16 of each module 10 is exposed through the single overmold body 18 by a cutting, drilling, or like operation, as illustrated in FIG. 7. This exposing step effectively cuts or drills through the overmold body 18 to or into, but preferably not through, all or select portions of the peripheral metallic structure of the metallic layer grid 14. Depending on design criteria, each meta-module 24 is cut or drilled such that the overmold body 18 of each component area 16 to be shielded is distinct from one another to form sub-modules 22. Although various exposing techniques are described further below, an exemplary technique employs sub-dicing. After portions of the peripheral metallic structure are exposed, an electromagnetic shield material is applied to all or a portion of the exterior surface of the overmold body 18 of each of the modules 10 and in contact with the exposed portion of the peripheral metallic structure to form an electromagnetic shield 20. The meta-module 24 is then singulated to form individual modules, which have one or more integrally shielded component areas, as will be described in detail below.

Figure 8A:
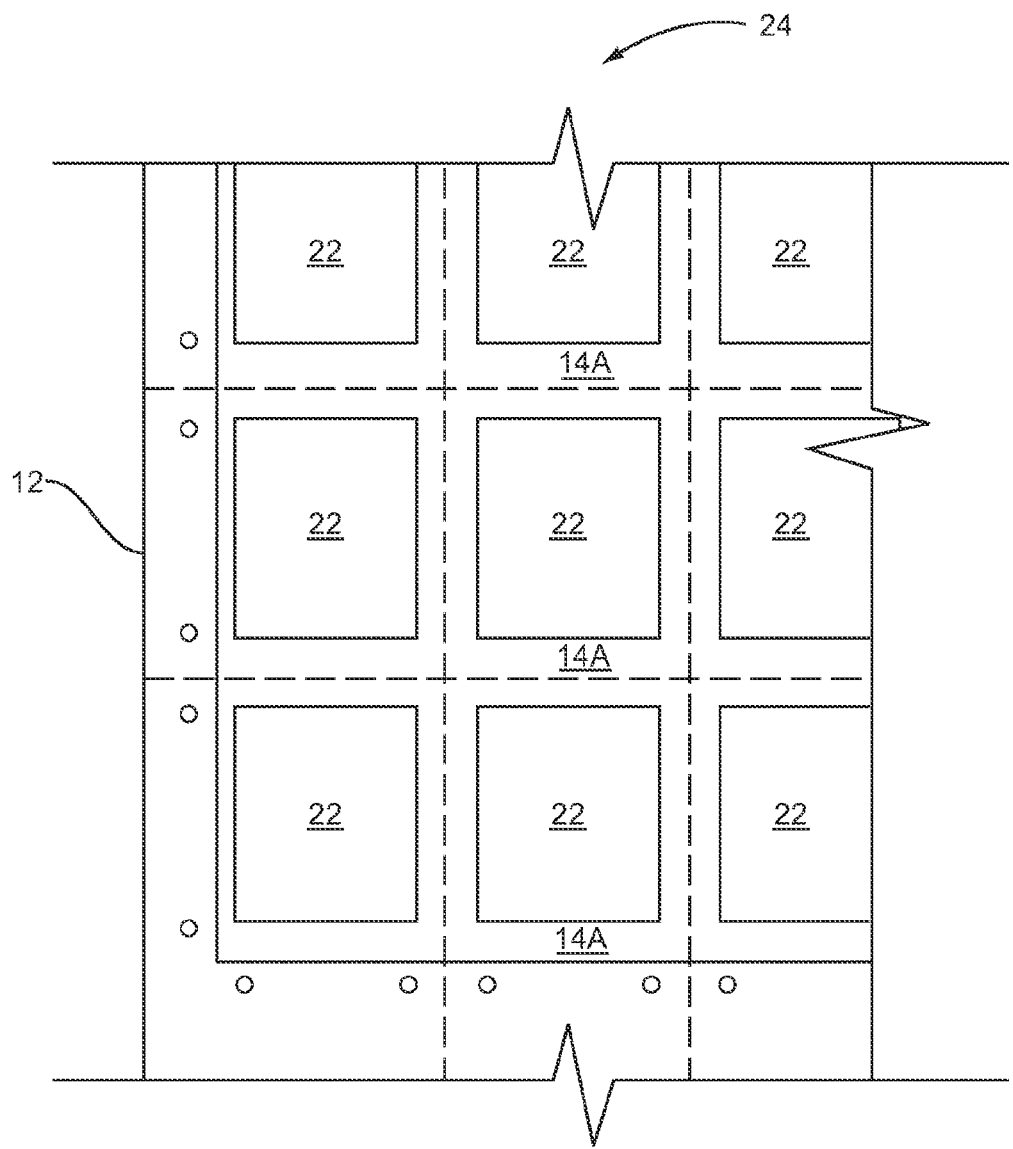
FIG. 8A illustrates a top plan view of part of the meta-module of FIG. 6 with singulation lines illustrated for creating modules like that illustrated in FIGS. 1A and 1B.
Figure 8B:
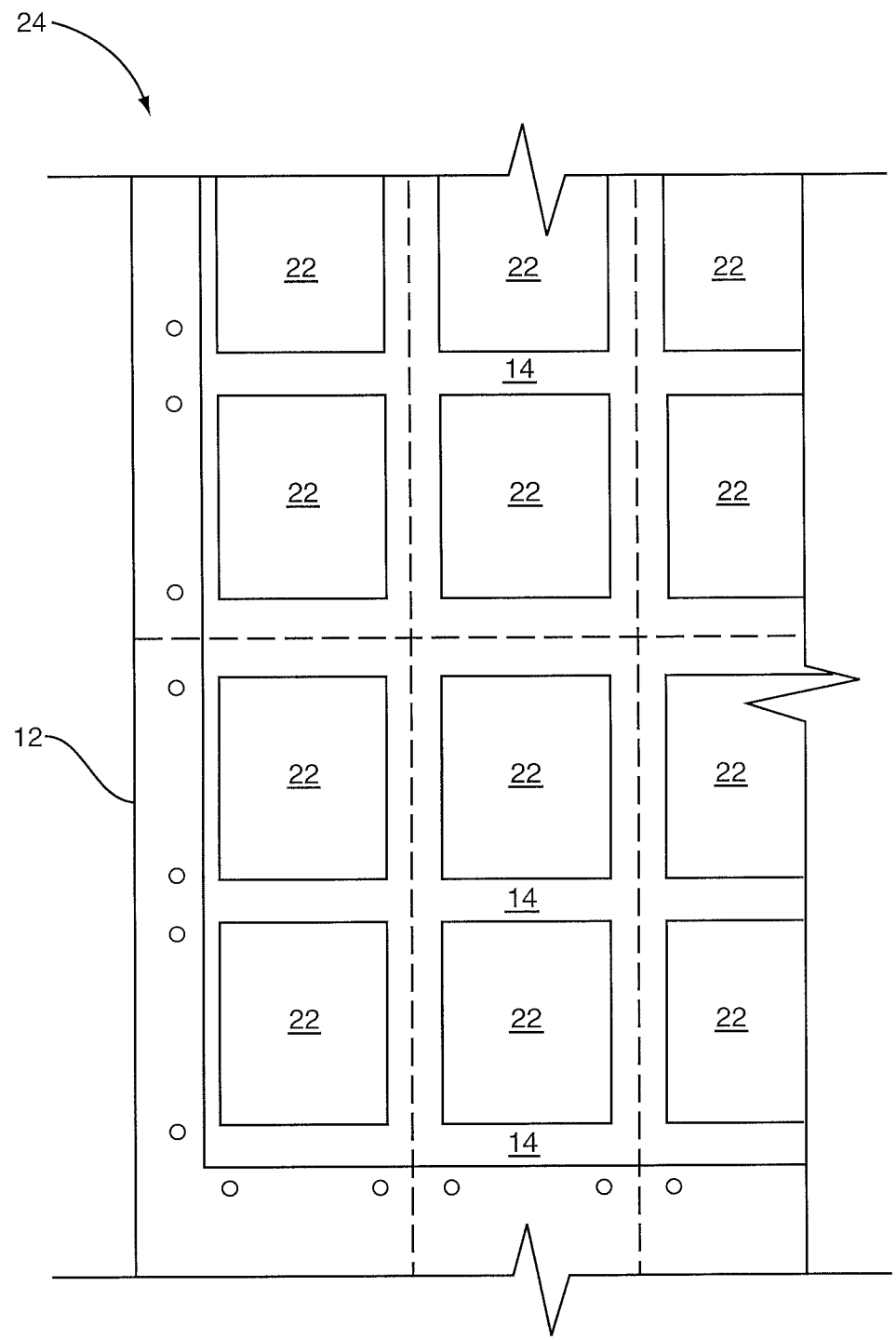
FIG. 8B illustrates a top plan view of part of the meta-module of FIG. 6 with singulation lines illustrated for creating a modules like that illustrated in FIGS. 2A and 2B.

FIG. 8A illustrates a top plan view of part of a meta-module 24 after sub-dicing, but before separation. In this example, the metallic layer grid 14 is exposed around the periphery of each sub-module 22, where each sub-module 22 corresponds to a portion of the meta-module 24 for a given component area 16. The dashed lines represent cuts to be made in a subsequent singulation process to form individual modules 10, which have a single sub-module 22. The singulation process separates the modules 10 from one another. Although each module 10 is shown having a single sub-module 22, those skilled in the art will recognize that a module 10 may include any number of sub-modules 22. For example, FIG. 8B illustrates an embodiment where each module 10 will include two adjacent sub-modules 22.

Figure 9:
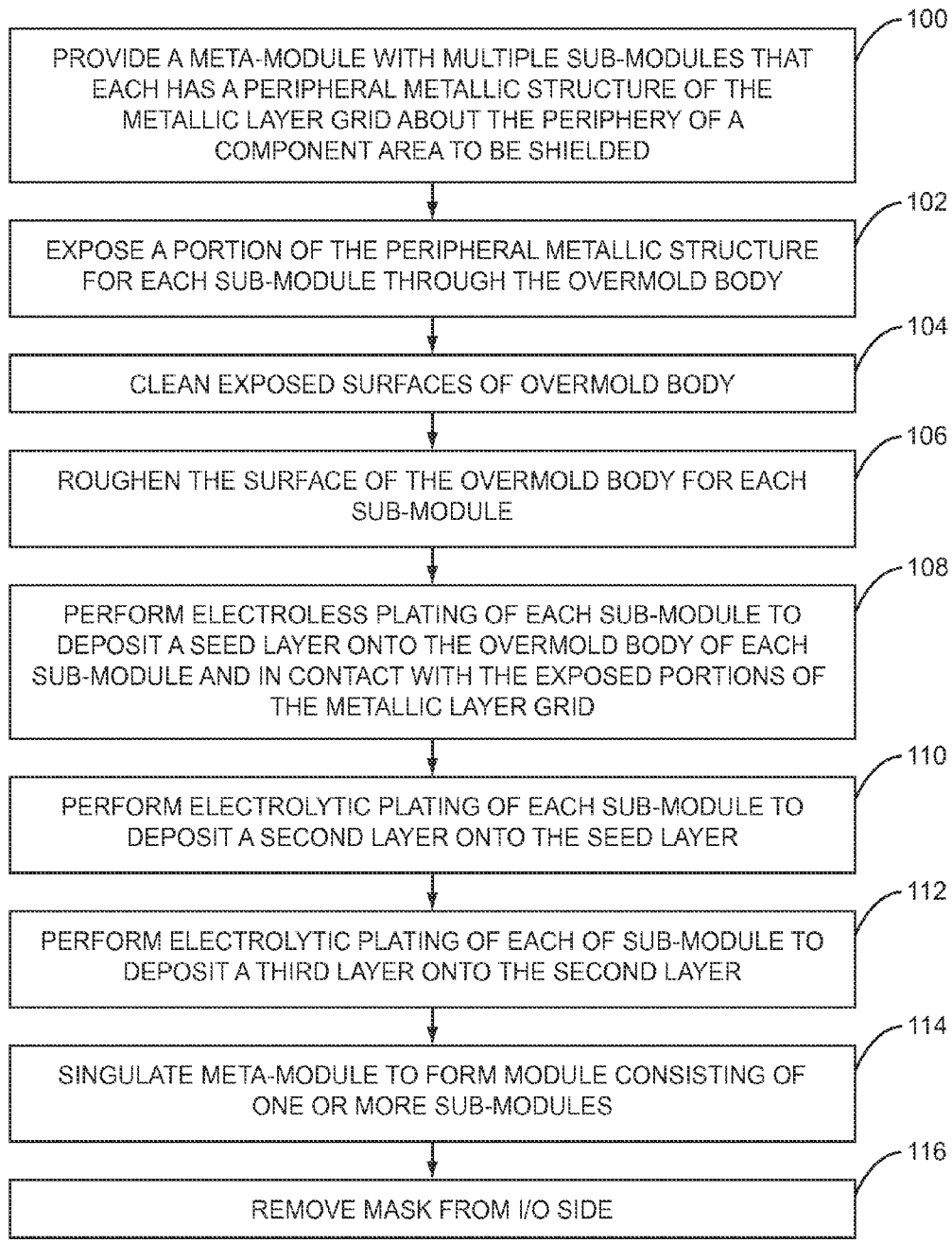
FIG. 9 is a flow diagram illustrating a manufacturing process according to a first embodiment of the present invention.
Figure 10:
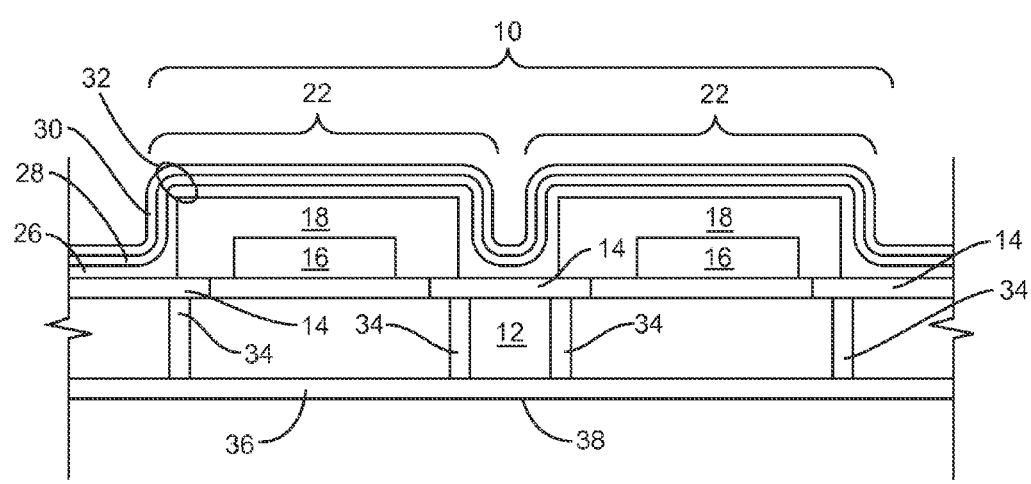
FIG. 10 illustrates an exemplary module constructed according to the embodiment of FIG. 9.

FIG. 9 provides a process flow diagram detailing the steps for creating the module 10 that is illustrated in FIG. 10 according to one embodiment of the present invention. In particular, a meta-module 24 is formed, wherein each sub-module 22 within the meta-module 24 has a peripheral metallic structure about the periphery of the component areas 16 to be shielded (step 100). The peripheral metallic structure is formed from the metallic layer grid 14.

Next, at least a portion of the peripheral metallic structure associated with each sub-module 22 is exposed through the overmold body 18 (step 102). For example, a sub-dicing process may be employed to cut through the overmold body 18 of each sub-module 22 to be shielded and to the metallic layer grid 14. Other exposing techniques are described further below. At this point, a portion of the metallic layer grid 14 is exposed about the periphery of the overmold body 18 for each sub-module 22.

The exposed surface of the overmold body 18 may be cleaned, preferably using a plasma cleaning process, to remove wax or other organic compounds and materials that remain on the surfaces of the overmold body 18 (step 104). The plasma cleaning process subjects the surface of the overmold body 18 to a reactive process gas, such as Argon, Oxygen, Nitrogen, Hydrogen, Carbon Tetrafluoride, Sulfur Hexafluoride, Nitrogen Tri-fluoride, or the like, which effectively etches away contaminants on the exposed surface of the overmold body 18. In essence, the contaminants are vaporized, burned, or otherwise removed from the exposed surface of the overmold body 18 when exposed to the process gas. Subsequently, the cleaned surface of the overmold body 18 for each sub-module 22 is preferably roughened through an abrasion process, a desmear technique, or like process (step 106). In one embodiment, a chemical roughening process is provided. It should be appreciated that a mask (not shown) may be positioned on the underside of the laminate 12 so that the processes described in the steps below do not interfere with any electrical contacts (not shown) on the bottom side of each sub-module 22. The mask helps prevent liquids and gases from reaching these electrical contacts, which may act as input/output contacts for the module 10. Alternatively, a seal structure may be employed, such as that described further below.

After roughening, an electroless plating process is performed to deposit a seed layer 26 of a conductive material on top of the overmold body 18 of the sub-module 22 and in contact with the exposed portions of the metallic layer grid 14 (step 108). In an exemplary embodiment, the seed layer 26 of conductive material may be Copper (Cu), Aluminum (Al), Silver (Ag), Gold (Au), or other material as needed or desired. An electroless plating process is defined herein to be a chemical deposition of metal instead of electrical-based deposition.

An exemplary electroless plating process of Cu on a dielectric substrate may require prior deposition of a catalyst such as a palladium-tin (Pd—Sn) colloid consisting of a metallic Pd core surrounded by a stabilizing layer of Sn ions. The activation step (deposition of the colloid) is usually followed by an acceleration step (removal of excess ionic tin). Adhesion of the deposit to the substrate is improved by the mechanical or chemical pretreatment steps described above. Other electroless plating processes could also be used and are considered within the scope of the present invention.

After the seed layer 26 of conductive material is created over the overmold body 18 of the sub-module 22 and in contact with the exposed portions of the metallic layer grid 14, an electrolytic plating process is performed to deposit a second layer 28 of conductive material on top of the initially deposited seed layer 26 (step 110). In an exemplary embodiment, the second layer 28 of conductive material may be Cu, Al, Ag, Au, or other material as needed or desired. It should be appreciated that the exposed portions of metallic layer grid 14 are electrically coupled to the seed layer 26, and the seed layer 26 then carries the current for the electrolytic plating process.

After the second layer 28 is generated, a third layer 30 is created on top of the second layer 28 through a second electrolytic plating process (step 112). The third layer 30 may be comparatively a poor conductor, and may be a layer of low stress nickel (Ni) or the like. Nickel serves to protect the conductive layers so that they do not tarnish, corrode, or otherwise suffer from environmental effects. Likewise, nickel may contribute to the shielding function by absorbing electromagnetic radiation.

In an exemplary embodiment, the seed layer 26, the second layer 28, and the third layer 30 form a shield 32, which is approximately 10-50 μm thick. Greater or lesser thicknesses may also be generated. At least one metallic coated or filled via 34 may electrically couple the peripheral metallic structure of the metallic layer grid 14 to a ground plane 36 on the bottom of or within the laminate 12 so that the peripheral metallic structure of the metallic layer grid 14 and the shield 32 are electrically grounded. The shield 32, vias 34, and ground plane 36 form an encapsulating shielding structure, which substantially encompasses the component area 16 of each sub-module 22.

After the electrolytic plating process of step 110, the meta-module 24 is singulated to form modules 10 having two or more sub-modules 22 (step 114). As used herein, the term "singulation" is defined to be the process wherein the individual modules 10 are separated one from the other using a cutting or like process, such that each module 10 is a single module. Finally, the mask, which is positioned on the underside of the strip of laminate 12, may be removed from an input/output (I/O) side 38 of the module 10 (step 116). It should be appreciated that some steps may be rearranged in the present process. For example, the mask may be removed prior to singulation. Likewise, if a layer 26, 28 or 30 is too thick, the layer may be ground or etched down to a desired thickness. Again, the end result of this embodiment may be a module 10 having two shielded sub-modules, as illustrated in FIG. 10, although the module 10 may be configured to have one or more sub-modules 22, where some or all of the sub-modules 22 have a shield 32. Although a particular plating process is described, various electroless or electrolytic plating techniques of any number of layers may be employed.

Figure 11:
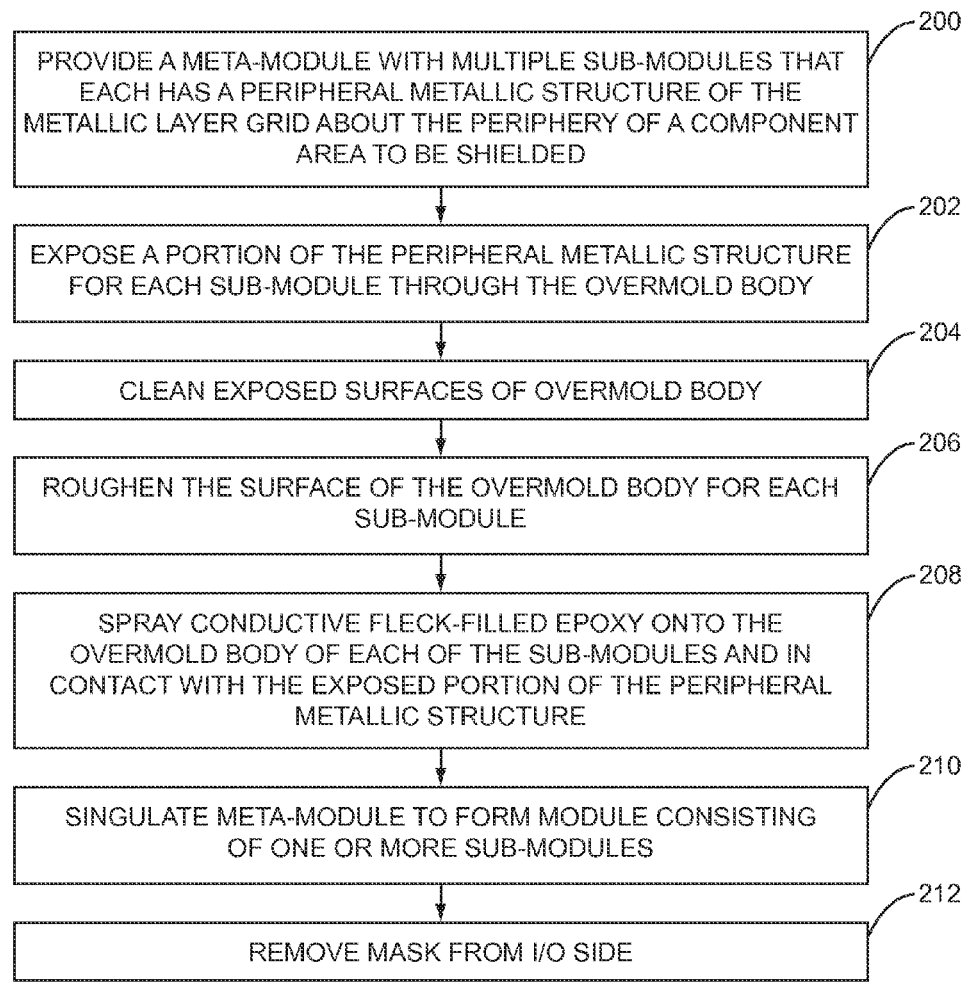
FIG. 11 is a flow diagram illustrating a manufacturing process according to a second embodiment of the present invention.
Figure 12:
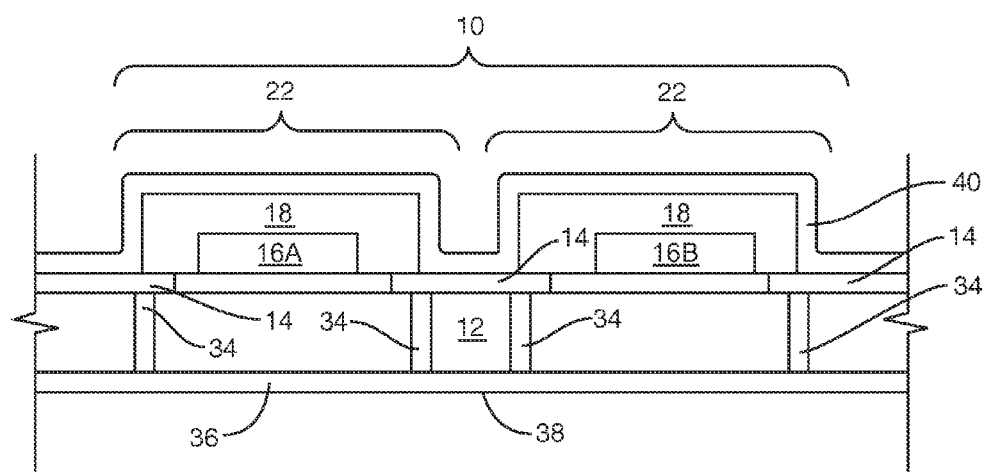
FIG. 12 illustrates an exemplary module constructed according to the embodiment of FIG. 11.

FIG. 11 illustrates a process flow diagram detailing the steps for creating the module 10 that is illustrated in FIG. 12 according to one embodiment of the present invention. As above, a meta-module 24 is initially formed, wherein each sub-module 22 within the meta-module 24 has a peripheral metallic structure about the periphery of the component areas 16 to be shielded (step 200), and the peripheral metallic structure is formed from the metallic layer grid 14.

Next, at least a portion of the peripheral metallic structure associated with each sub-module 22 is exposed through the overmold body 18 (step 202). Again, a sub-dicing process may be employed to cut through the overmold body 18 of each sub-module 22 and to the metallic layer grid 14, while other possible exposing techniques are described further below. At this point, a portion of the metallic layer grid 14 is exposed about the periphery of the overmold body 18 for each sub-module 22.

The exposed surface of the overmold body 18 may be cleaned, preferably using a plasma cleaning process, to remove wax or other organic compounds and materials that remain on the surface of the overmold body 18 (step 204). Subsequently, the cleaned surface of the overmold body 18 for each sub-module 22 may be roughened through an abrasion process, a desmear technique, or like process (step 206).

After roughening, a conductive fleck-filled epoxy 40 may be sprayed over the overmold body 18 of each of the sub-modules 22 and in contact with the metallic layer grid 14 (step 208). In an exemplary embodiment, the conductive fleck-filled epoxy 40 is CHO-SHIELD 610 sold by Chomerics of 77 Dragon Court, Woburn, Mass. 01801. In certain embodiments, the conductive flecks of the conductive fleck-filled epoxy 40 may be Cu, Ag, a mixture of Cu and Ag, a tin/zinc (Sn/Zn) alloy, or other conductive material as needed or desired. Those skilled in the art will recognize other available conductive sprays to use for shielding material. While CHO-SHIELD 610 has an epoxy 40 to carry the conductive flecks, other materials such as polyurethane, acrylic, urethane, or the like could be the medium in which the conductive flecks are carried. Further, multiple coats of shielding material may be applied.

One or more metallic coated or filled vias 34 may electrically couple the metallic layer grid 14 to a ground plane 36 on the bottom of or within the laminate 12 so that the metallic layer grid 14 and the conductive fleck-filled epoxy 40 are electrically grounded. The conductive fleck-filled epoxy 40, vias 34, and ground plane 36 form a shielding structure, which substantially encompasses the component area 16A or 16B of each sub-module 22.

After application of the conductive fleck-filled epoxy 40, the meta-module 24 is singulated to form modules 10 having one or more sub-modules 22 (step 210). Again it should be appreciated that a mask may be removed from an input/output side 38 of the module 10 (step 212). This mask may be removed before singulation if needed or desired.

In the above embodiments, the various component areas 16A and 16B that are provided in a module 10, which has multiple sub-modules 22, were illustrated as being substantially adjacent to one another. As such, a portion of the peripheral metallic structure for the adjacent component areas 16A and 16B may be formed from the same portion of the metallic layer grid 14. In other words, the adjacent component areas 16A and 16B may share a common portion of a peripheral metallic structure. However, separate component areas 16 that are located on a single module 10 may be spaced apart from one another and may be associated with peripheral metallic structures that are physically separate from one another, electrically isolated from one another, or both. In certain embodiments, resultant shielding structures may be isolated from one another electrically, while other structures may have their structures substantially physically isolated from one another, wherein the respective shielding structures may be coupled to one another through one or more dedicated traces on the surface of the laminate structure or through electrical connections therein.

Figure 13A:
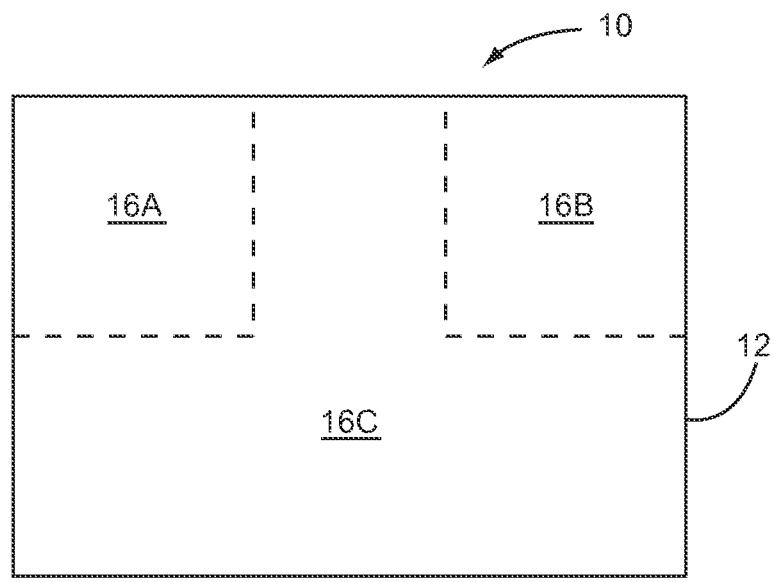
FIGS. 13A and 13B illustrate isolated component areas to be shielded according one embodiment of the present invention.
Figure 13B:
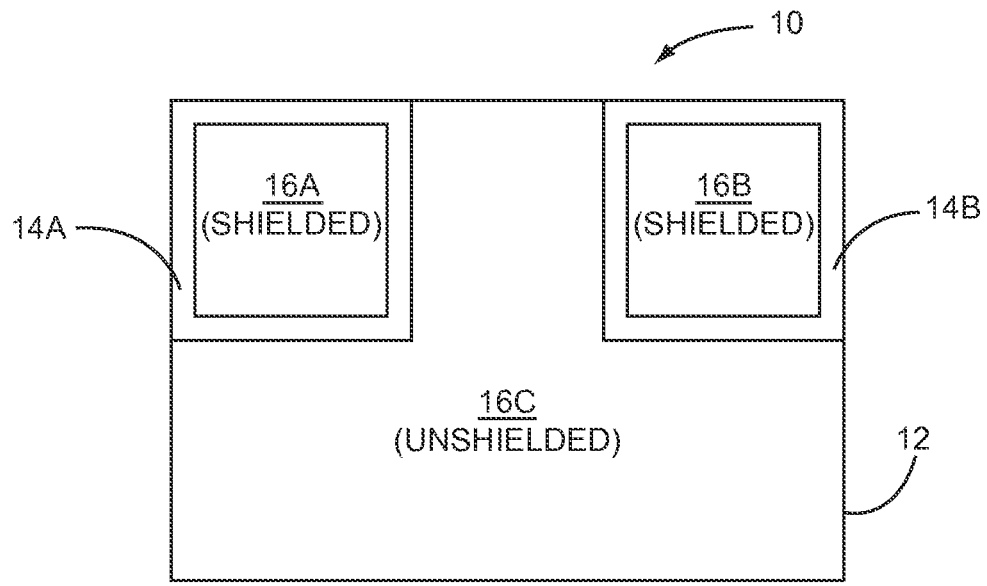

With reference to FIG. 13A, a module 10 is illustrated as having three component areas 16A, 16B, 16C. In this embodiment, assume that component areas 16A and 16B are to be shielded, and component area 16C will not be shielded, at least according to the shielding techniques of the present invention. As illustrated, component areas 16A and 16B are not adjacent to one another, and are physically separated from one another on the surface of the laminate 12 by component area 16C or other area. With reference to FIG. 13B, the peripheral metallic structures 14A and 14B of the metallic layer grid 14 are provided about the component areas 16A and 16B, respectively. Notably, the peripheral metallic structures 14A and 14B are at least physically isolated from one another, and depending on the electrical connections implemented on or within the laminate 12, may be electrically isolated from one another. In many embodiments, the peripheral metallic structures 14A and 14B may be ultimately electrically connected to different or the same ground planes, which are provided within the laminate structure. Such embodiments are particularly beneficial when the electrical components in the respective component areas 16A and 16B tend to interfere with one another, such as in the case where one component area 16A includes analog electronics and the other component area 16B includes digital electronics.

In such embodiments, all or a portion of the peripheral metallic structures 14A and 14B are exposed through an overmold body 18 (not illustrated in FIGS. 13A and 13B). Once these portions of the peripheral metallic structures 14A and 14B are exposed, the cleaning, roughing, and shield material application steps may be provided. If physical or electrical isolation of the respective shields for the component areas 16A and 16B is required, additional steps may be required to ensure that the shield material used to form the resultant electromagnetic shields 20 are isolated from one another. An exemplary process to maintain separation between the shields 20 for the respective component areas 16A and 16B is illustrated in FIGS. 14A-14D.

Figure 14A:
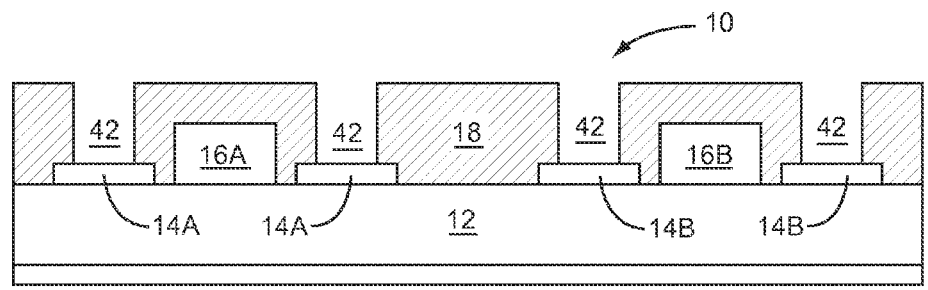
FIGS. 14A through 14D illustrate a process for providing isolated electromagnetic shields on a given module according to one embodiment of the present invention.
Figure 14B:
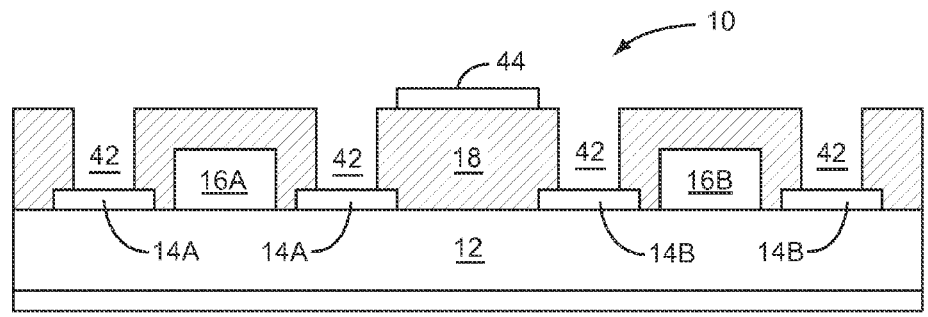

With reference to FIG. 14A, a cross-section of a module 10 is illustrated at a point after portions of the peripheral metallic structures 14A and 14B, which are associated with the component areas 16A and 16B, have been exposed through the overmold body 18. The exposing process results in openings 42 extending through the overmold body 18 to the peripheral metallic structures 14A and 14B. Prior to forming the different electromagnetic shields 20, a shield material mask 44, such as a plating mask or a spray mask, is applied in a manner that isolates the areas in which the respective electromagnetic shields 20 are formed. As illustrated in FIG. 14B, the shield material mask 44 is provided between the areas in which the respective electromagnetic shields 20 will be formed for the respective component areas 16A and 16B.

Figure 14C:
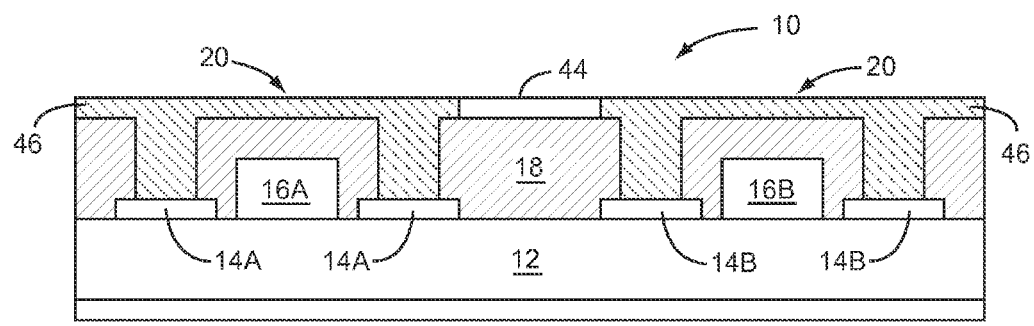
Figure 14D:
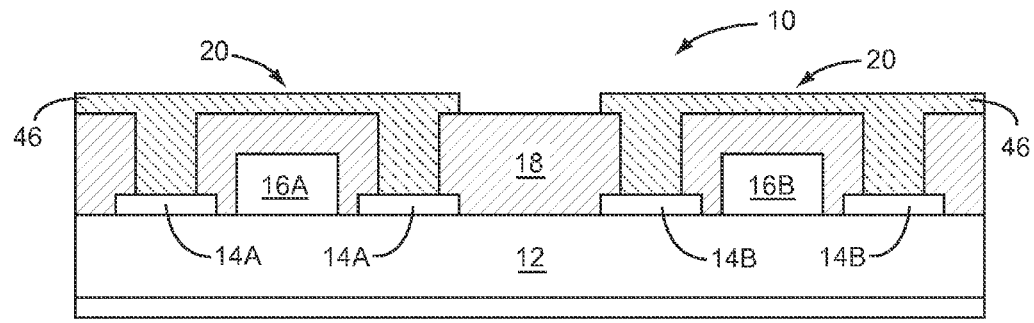

With reference to FIG. 14C, the electromagnetic shield material 46 necessary to form the respective electromagnetic shields 20 is applied over the portions of the overmold body 18 that are associated with the respective component areas 16A and 16B to form the electromagnetic shields 20. Notably, the electromagnetic shield material mask 44 prevents the electromagnetic shield material 46 associated with the different electromagnetic shields 20 from coming into contact with each other. As such, the electromagnetic shields 20 are formed about the component areas 16A and 16B over the respective portions of the overmold body 18, yet remain at least physically separate from one another. In a subsequent step, the electromagnetic shield material mask 44 may be removed, as illustrated in FIG. 14D. Notably, any number of component areas 16 may be provided on a module 10. The resultant shielding for these component areas 16 may be isolated or connected, wherein certain ones or groups of component areas 16 may be isolated from one another and other ones or groups of component areas 16 may be connected to one another. The desired shielding requirements for the electrical components provided in the respective component areas 16 should dictate such design decisions.

With many embodiments of the present invention, an exposing process is employed to remove a portion of the overmold body 18 (or like body) that is above the portion of the peripheral metallic structure to be exposed, such that the electromagnetic shield material 46 may be applied over the remaining portion of the overmold body 18 and into the openings 42 that are created over the exposed portions of the peripheral metallic structure. Various methods may be employed to create the openings 42 through the overmold body 18, either to or partially into the exposed portions of the peripheral metallic structure. These methods include sub-dicing (mechanical cutting), laser ablation, laser drilling, mechanical drilling, plasma etching, and the like. Notably, chemical-based etching techniques may generally be considered as cutting techniques. Further, a molding tool or form may be provided in association with forming the overmold body 18, wherein all or a portion of the openings 42 are reserved using the form.

Figure 15A:
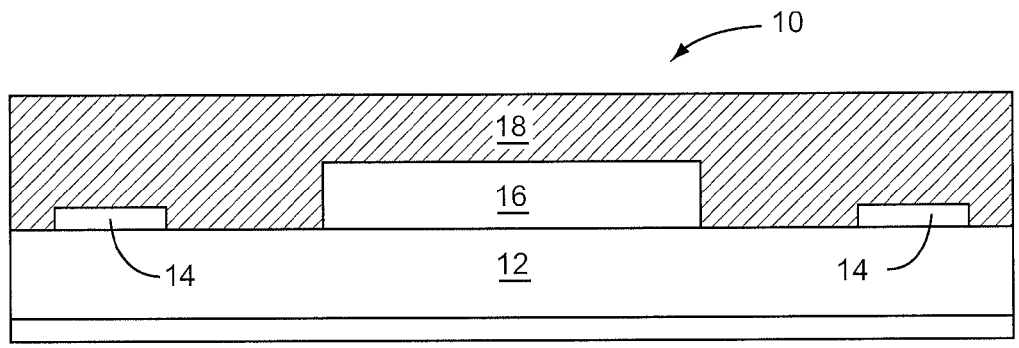
FIGS. 15A through 15F illustrate a process employing a sub-dicing or like mechanical cutting process for providing an integrated electromagnetic shield according to one embodiment of the present invention.
Figure 15B:
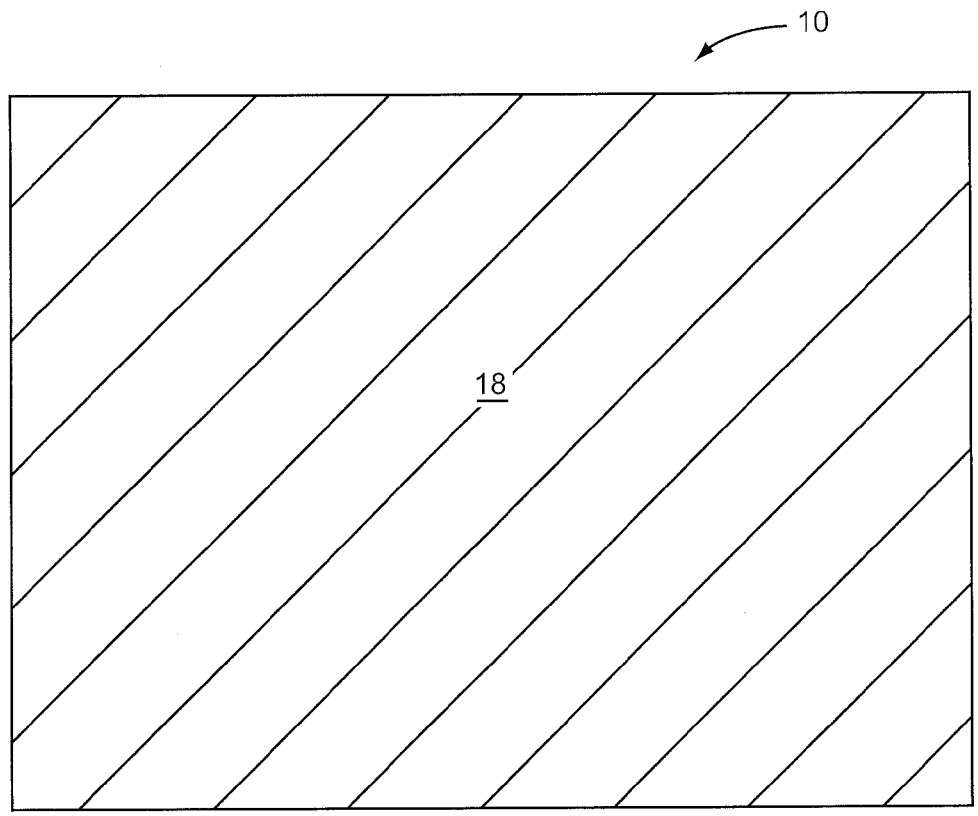

With reference to FIGS. 15A and 15B, a module 10 is illustrated prior to employing an exposing process to create the openings 42, which are formed through the overmold body 18 to or into the portions of the peripheral metallic structure of the metallic layer grid 14 that are to be exposed. FIG. 15A is a cross-section of the module 10, and FIG. 15B is a top view of the module 10. As illustrated, the overmold body 18 covers the metallic layer grid 14 and the component area 16, as well as the remaining surface of the laminate structure.

Figure 15C:
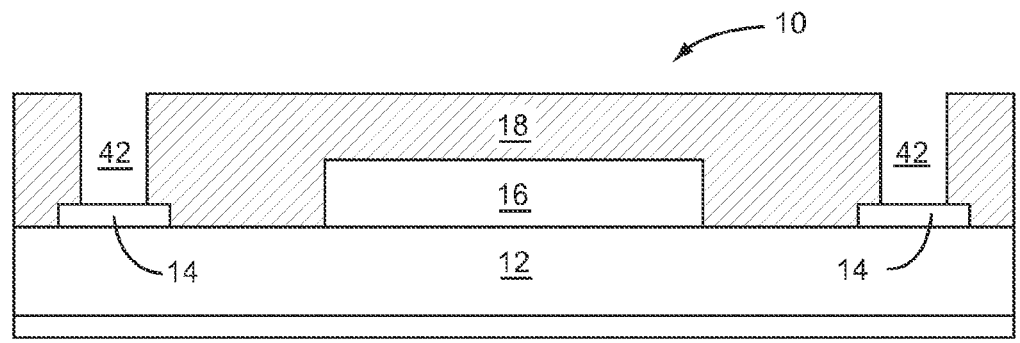
Figure 15D:
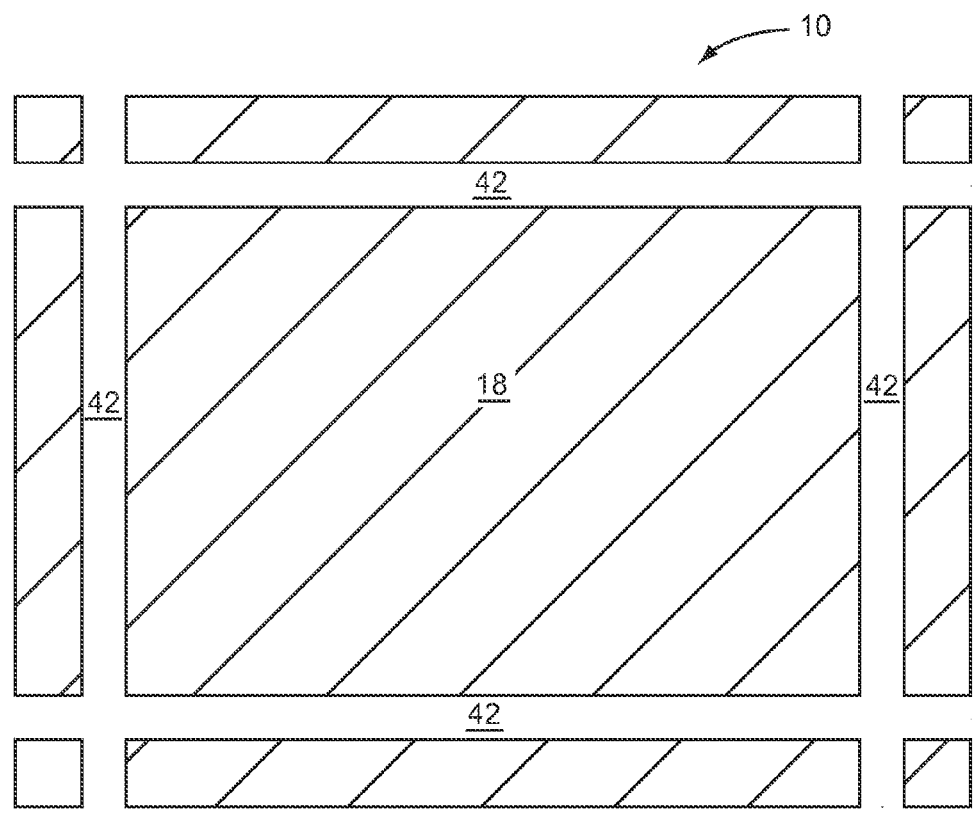
Figure 15E:
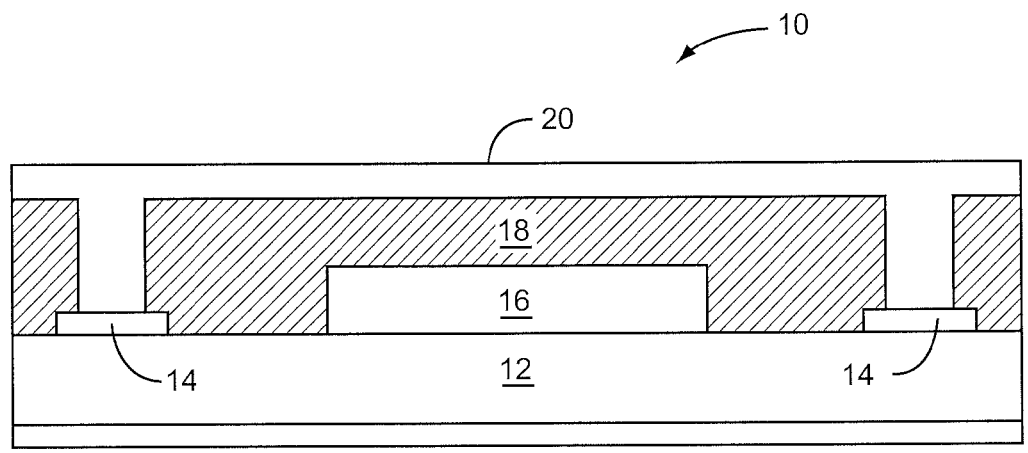
Figure 15F:
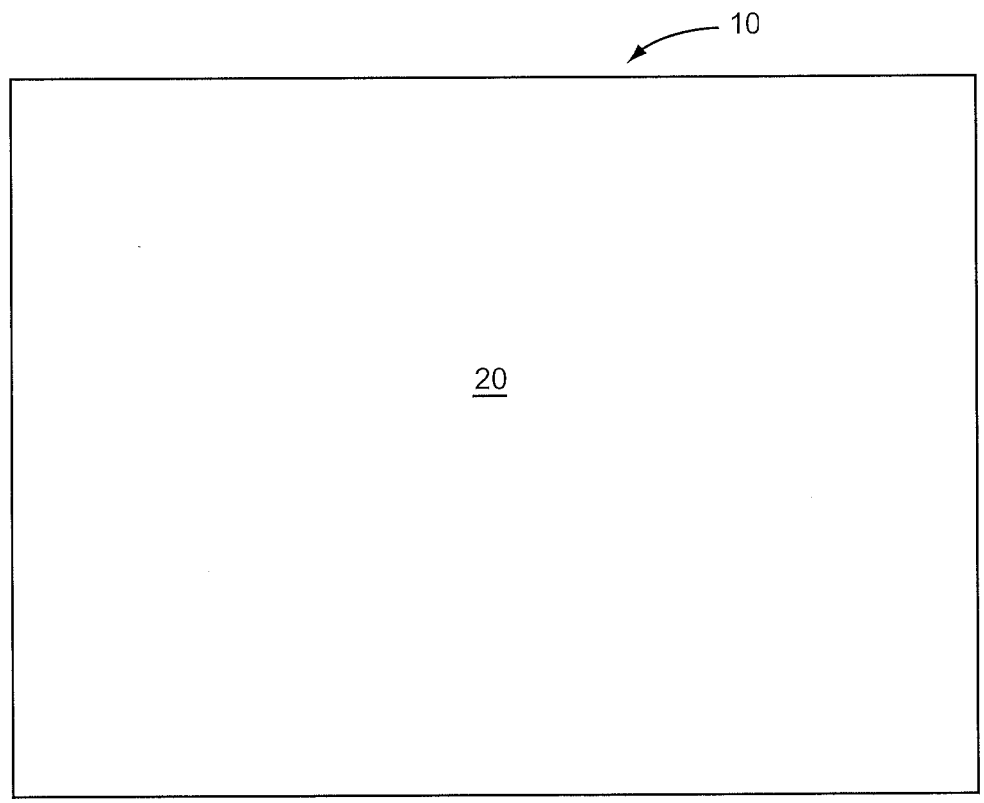

With reference to FIGS. 15C and 15D, the module 10 has been subjected to a sub-dicing operation where a saw is used to form the openings 42 over substantially all of the peripheral metallic structure provided by the metallic layer grid 14. FIG. 15C is a cross-sectional view of the module 10, and FIG. 15D is a top view of the module 10. Since the sub-dicing step employs a saw, the openings 42 tend to take the form of trenches, which reside over the peripheral metallic structure of the metallic layer grid 14. In certain embodiments, these trenches may extend past the peripheral metallic structure, which runs immediately about the component area 16. Preferably, a depth-controlled cutting process is used to allow the saw to cut through the overmold body 18 to or slightly into the peripheral metallic structure, yet prevent the saw from cutting all the way through the peripheral metallic structure. With reference to FIGS. 15E and 15F, the electromagnetic shield 20 is formed over the overmold body 18 and into the openings 42 as described above. FIG. 15E provides a cross-sectional view of the module 10 and FIG. 15F provides a top view of the module 10, after the electromagnetic shield 20 is formed.

Figure 16A:
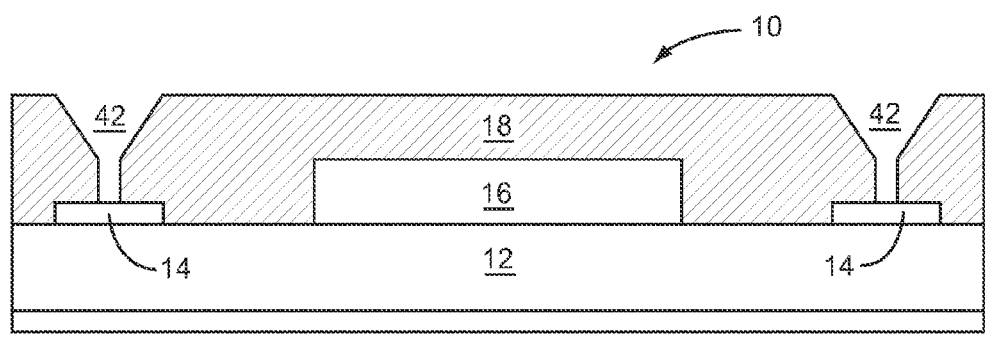
FIGS. 16A through 16D illustrate a process employing a laser cutting process for providing an integrated electromagnetic shield according to one embodiment of the present invention.
Figure 16B:
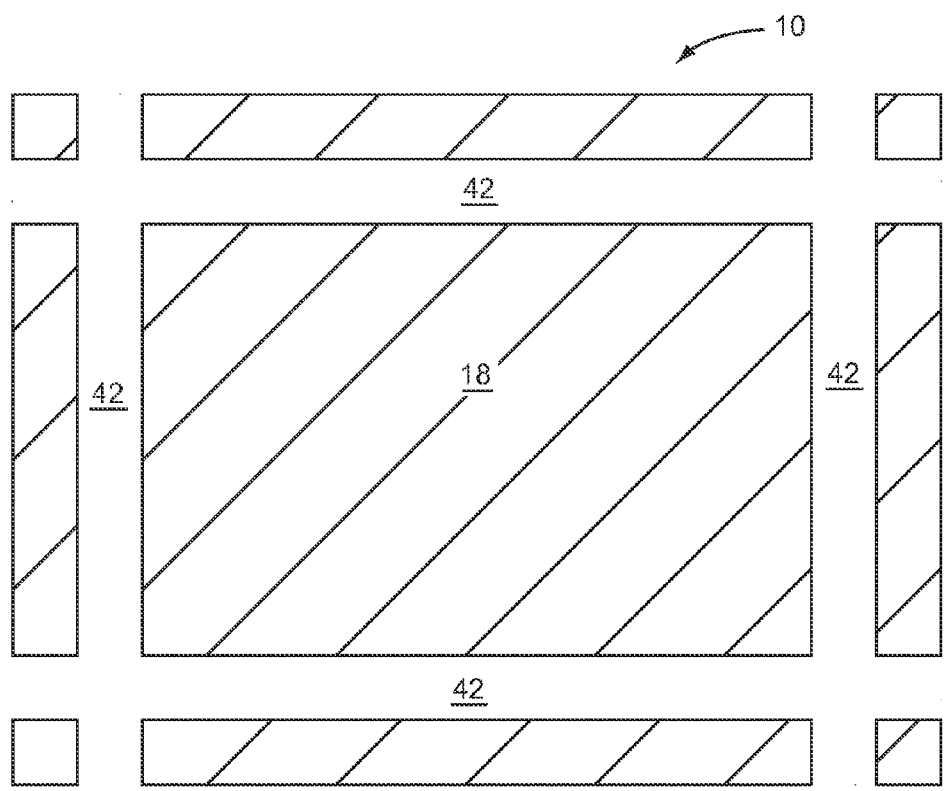
Figure 16C:
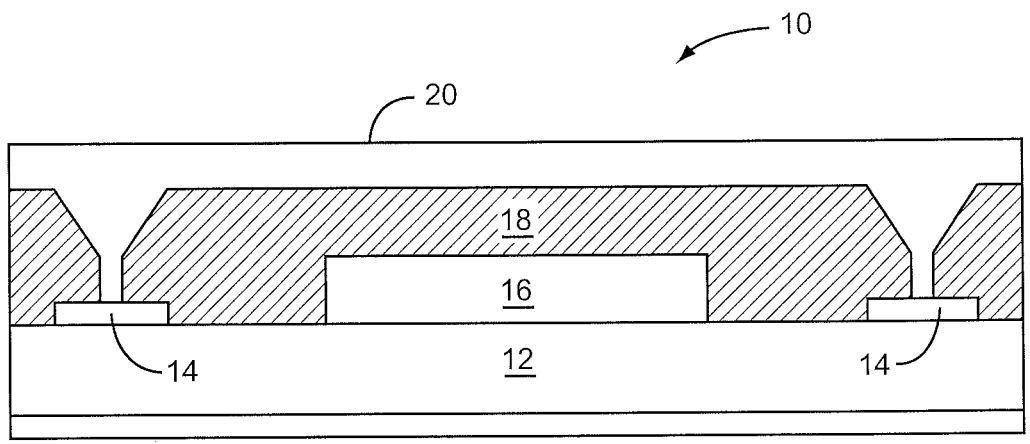
Figure 16D:
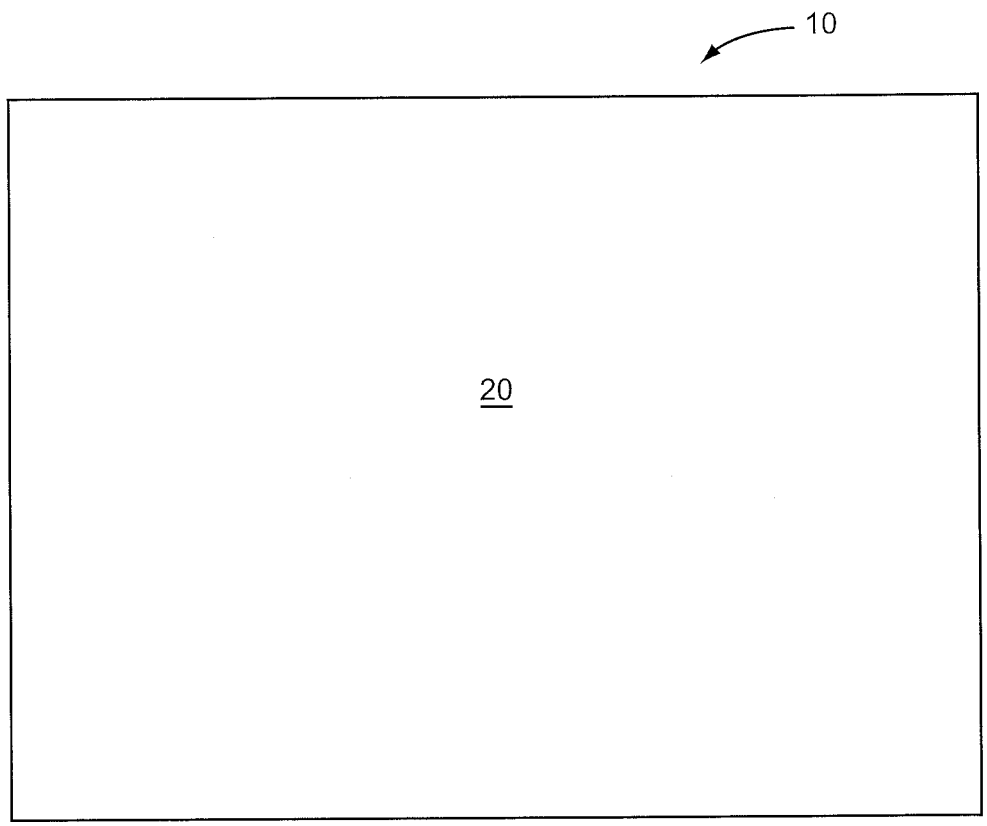

As noted, laser ablation may also be used to form the openings 42 through the overmold body 18. In general, laser ablation is the use of a laser to cut through the overmold body 18 in an analogous fashion to that provided during a sub-dicing process. One advantage of using a laser is the ability to more precisely control the location and depth of the cutting operation. Since the ability to precisely control the cutting depth when forming the openings 42 is important, the ability to immediately turn on or off a laser employed in a cutting process makes laser ablation particularly beneficial in forming the openings 42. Notably, certain laser ablation techniques result in trapezoidal trenches being formed for the openings 42, such as those illustrated in FIGS. 16A and 16B. FIG. 16A is a cross-section of a module 10 after the openings 42 have been formed using laser ablation, and FIG. 16B is a top view. FIGS. 16C and 16D, which are cross-sectional and top views of the module 10, respectively, illustrate the module 10 after formation of the electromagnetic shield 20 over the overmold body 18 and into the openings 42.

Figure 17A:
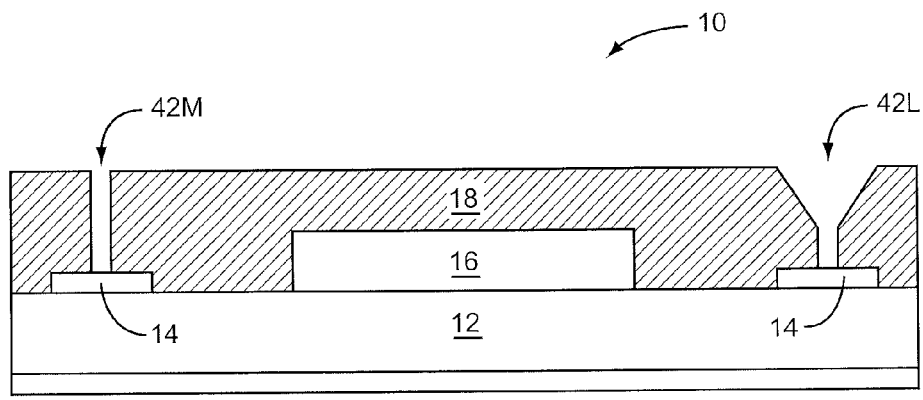
FIGS. 17A through 17D illustrate a process employing a mechanical or laser drilling process for providing an integrated electromagnetic shield according to one embodiment of the present invention.
Figure 17B:
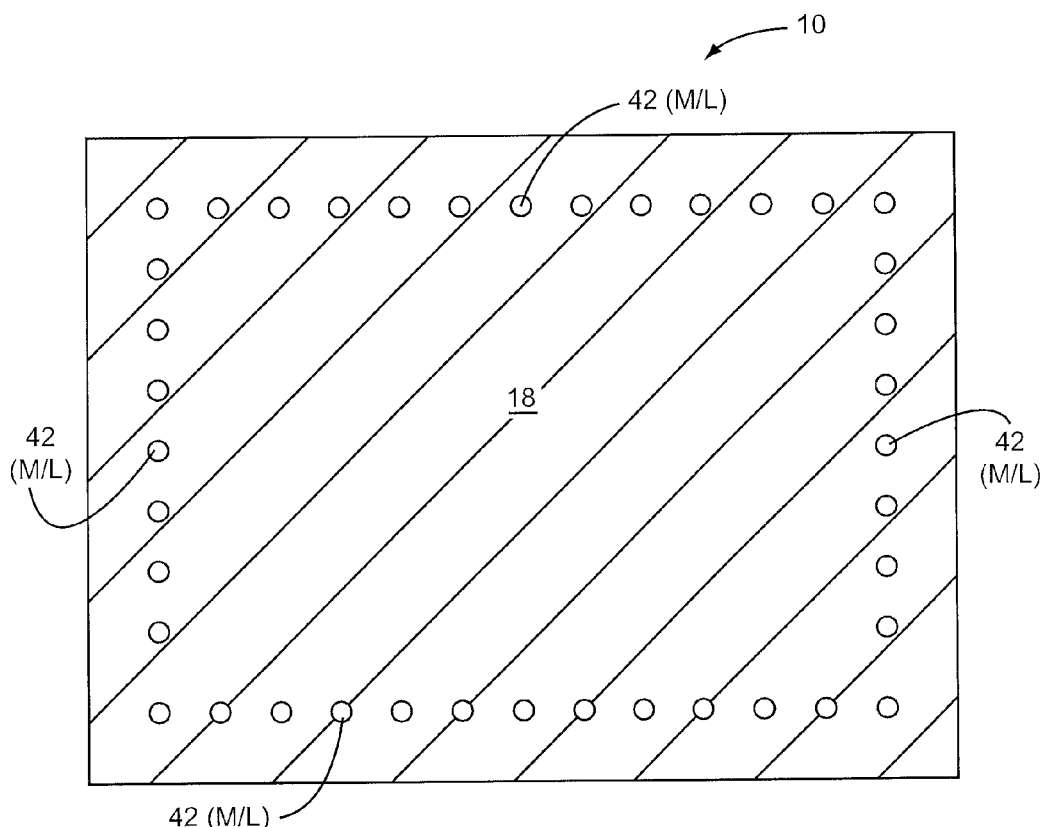

In addition, mechanical and laser drilling processes may be employed to form the openings 42. With reference to FIGS. 17A and 17B, which are cross-sectional and top views of the module 10, respectively, prior to formation of the electromagnetic shield 20, both types of openings 42 are depicted. The opening 42 formed by mechanical drilling is referenced as 42M, and the opening formed by laser drilling is referenced as 42L. Notably, it would be unlikely that both mechanical and laser drilling would be used to form the openings 42 for the same module 10. These differently formed openings 42M and 42L are merely illustrated to represent the different shapes that the openings 42M and 42L may take using the different drilling processes.

Figure 17C:
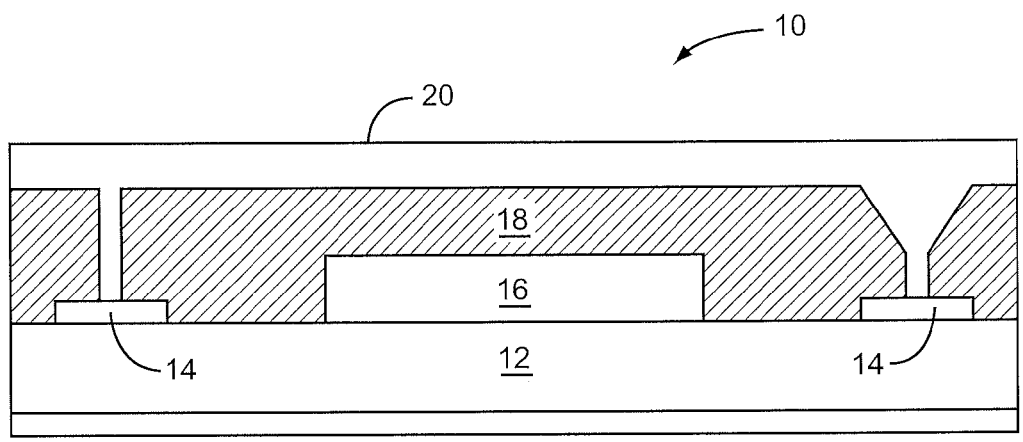
Figure 17D:
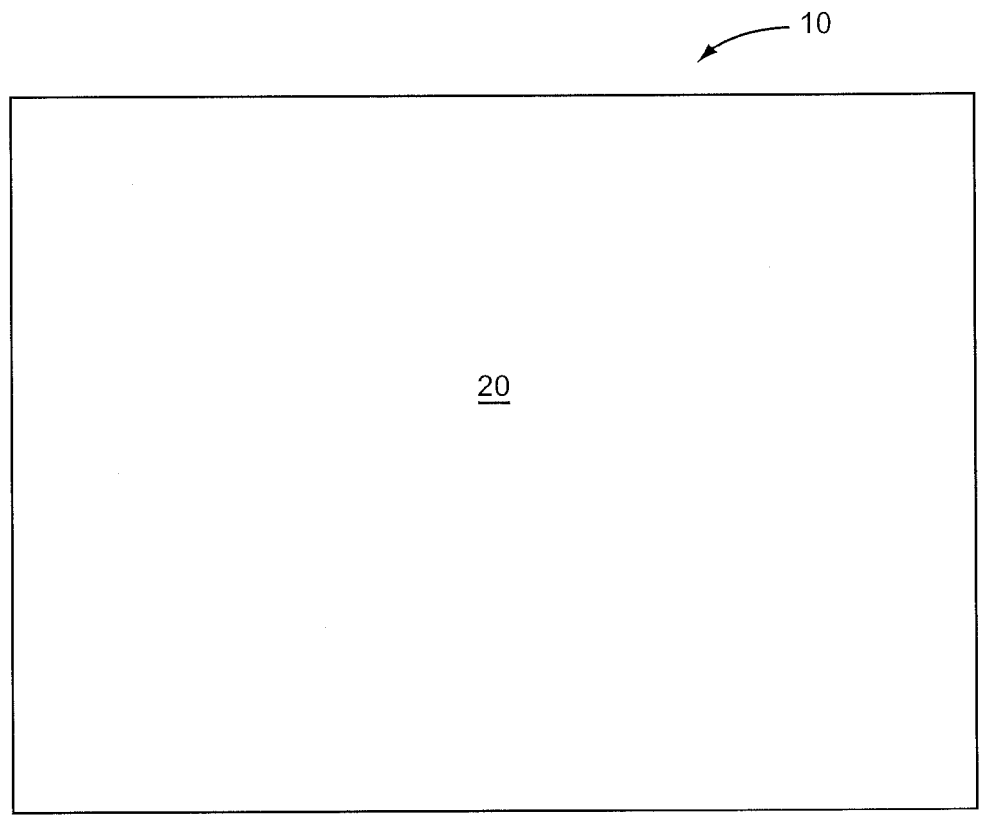

As illustrated, openings 42M or 42L (42M/L) are drilled through the overmold body 18 to or into the peripheral metallic structure of the metallic layer grid 14 about the component area 16. The size and number of openings 42M/L may be based on design criteria or shielding requirements. With reference to FIGS. 17C and 17D, the cross-sectional and top views, respectively, of the module 10 are illustrated after formation of the electromagnetic shield 20 over the overmold body 18 and into the drilled openings 42M or 42L.

Figure 18A:
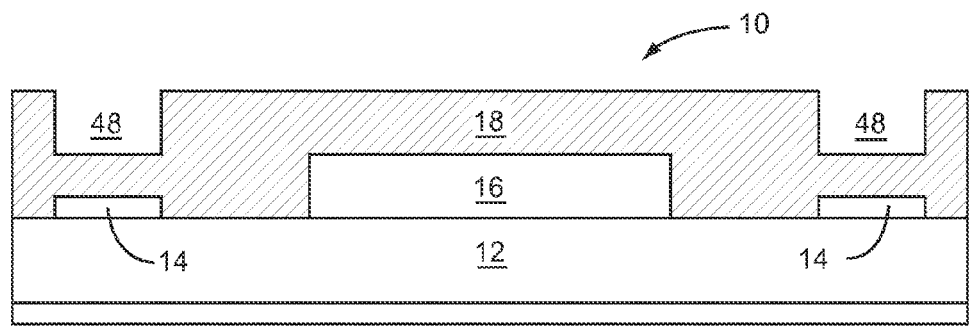
FIGS. 18A through 18F illustrate a process employing a molding form for providing an integrated electromagnetic shield according to one embodiment of the present invention.
Figure 18B:
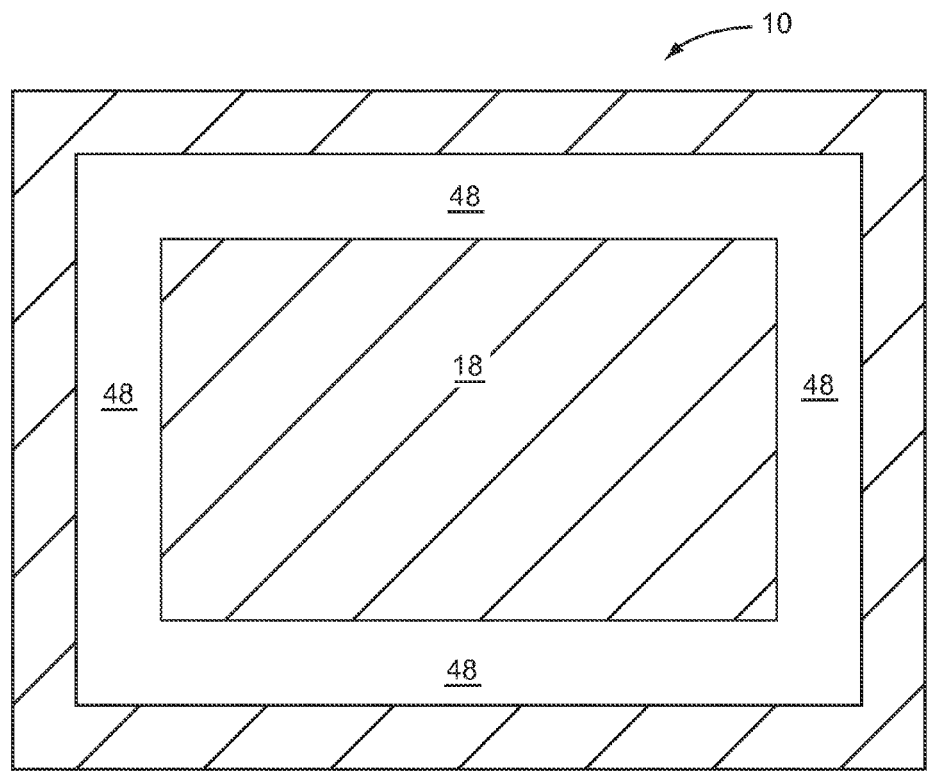
Figure 18C:
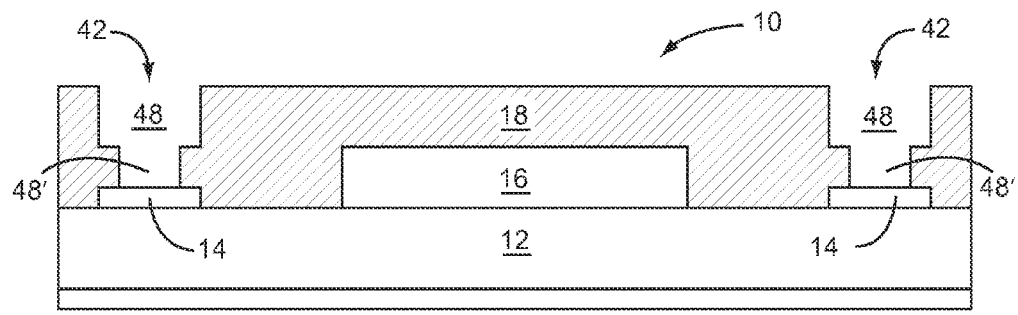
Figure 18D:
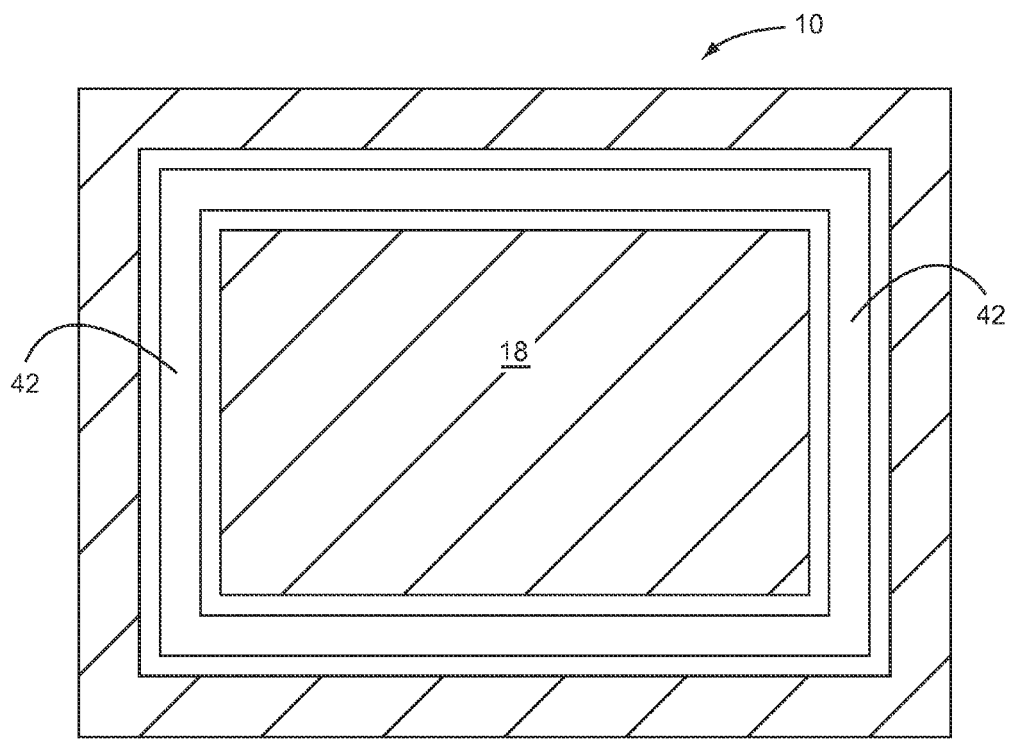

FIGS. 18A-18F illustrate an embodiment wherein the openings 42 are created using a two-step process, which employs a form to initially create a form opening 48 in the overmold body 18 while the overmold body 18 is being formed. Reference is now made to FIGS. 18A and 18B, which are cross-sectional and top views, respectively, of a module 10 after an overmold body 18 has been formed. Notably, while the overmold body 18 was being formed, a form was used to create the form openings 48, which are represented as trenches over and about the component area 16 within the overmold body 18. After the overmold body 18 sets, the form is removed from the overmold body 18 to leave the form opening 48. The form opening 48 in this embodiment does not extend all the way to the peripheral metallic structure provided by the metallic layer grid 14. Instead, a portion of the overmold body 18 remains between the bottom of the form opening 48 and the top of the peripheral metallic structure. Thus, to expose at least portions of the peripheral metallic structure, an additional step is necessary to cut or drill through the overmold body 18 from the bottom of the form opening 48 to the portions of the peripheral metallic structure that must be exposed. A laser or mechanical drilling or cutting process may be used to form the secondary opening 48' that extends from the bottom of the form opening 48 to or into the exposed portions of the peripheral metallic structure, as illustrated in FIGS. 18C and 18D, which are cross-sectional and top views, respectively.

Figure 18E:
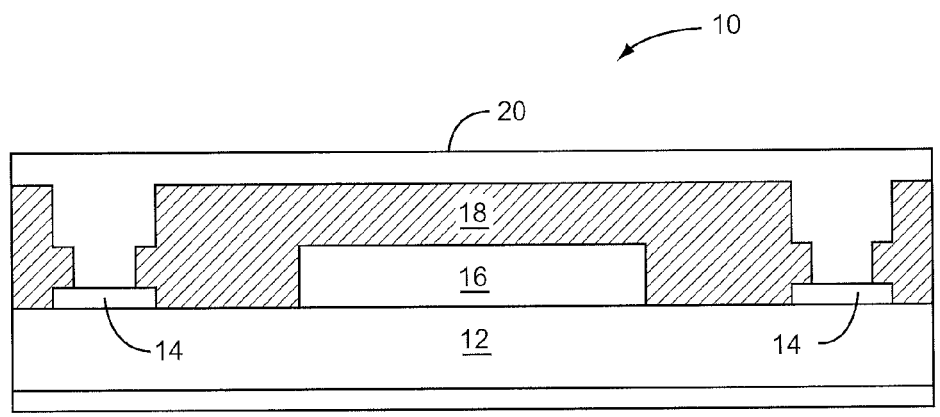
Figure 18F:
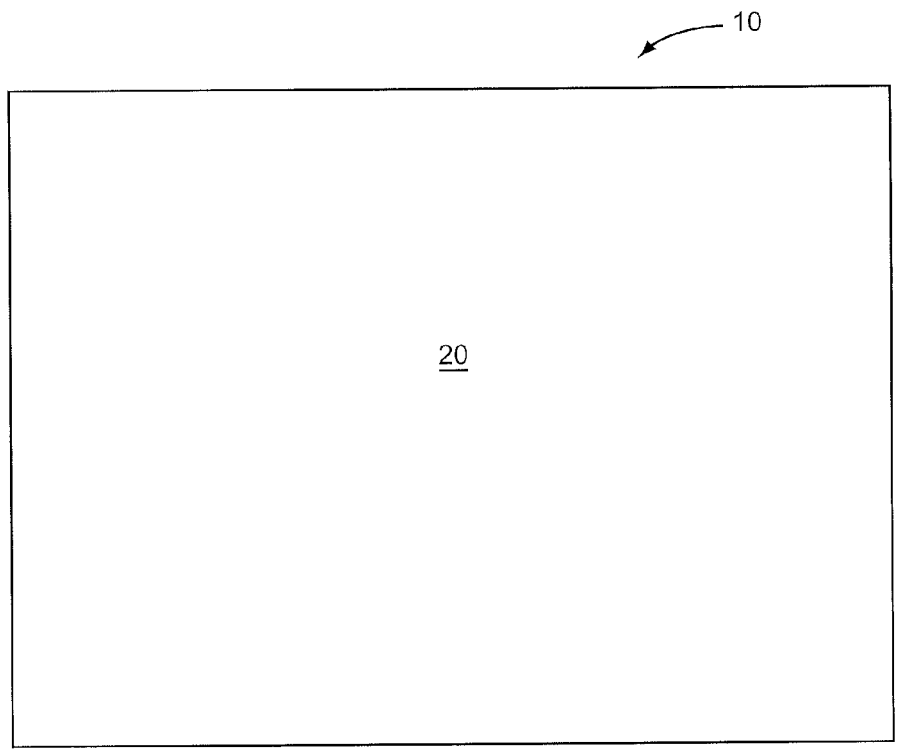

With reference to FIGS. 18E and 18F, cross-sectional and top views, respectively, of the module 10 are provided after the electromagnetic shield 20 is formed over the overmold body 18 and into the form opening 48 and the secondary opening 48'. The form opening 48 and the secondary opening 48' create an overall opening 42. In all of the above embodiments, the electromagnetic shield 18 will extend from at least a portion of the top of the overmold body 18 through the openings 42 to the peripheral metallic structure.

In certain embodiments, the cutting or drilling operations used to form the openings 42 apply significant down force to the laminate 12. In many instances, the down force may cause the laminate 12 to flex downward, which may affect the depth of the openings 42. If the laminate 12 flexes too much, an opening 42 may not reach the peripheral metallic structure. As such, the resultant electromagnetic shield 20 will not come into electrical contact with the exposed portion of the peripheral metallic structure, which will affect the shielding performance of the electromagnetic shield 20. If the openings 42 extend too far, all or too much of the peripheral metallic structure may be removed by the cutting or drilling process, again affecting the electrical contact between the peripheral metallic structure and the electromagnetic shield, and in turn affecting the performance of the electromagnetic shield 20.

With reference to FIG. 19, a portion of a meta-module 24 is illustrated, wherein the outside edges of the meta-module 24 include a metal layer 50 and a masking material 52, such as a solder mask, on the underside of the laminate 12. The metal layer 50 and the masking material 52 effectively raise the bottom surface of the laminate 12 above a processing surface at the middle of the meta-module 24. Accordingly, down forces applied during cutting and drilling operations to the middle of the meta-module 24 will cause the laminate 12 to flex downward, which may affect the overall depth of the openings 42 that are created using the cutting or drilling process.

Figure 21:
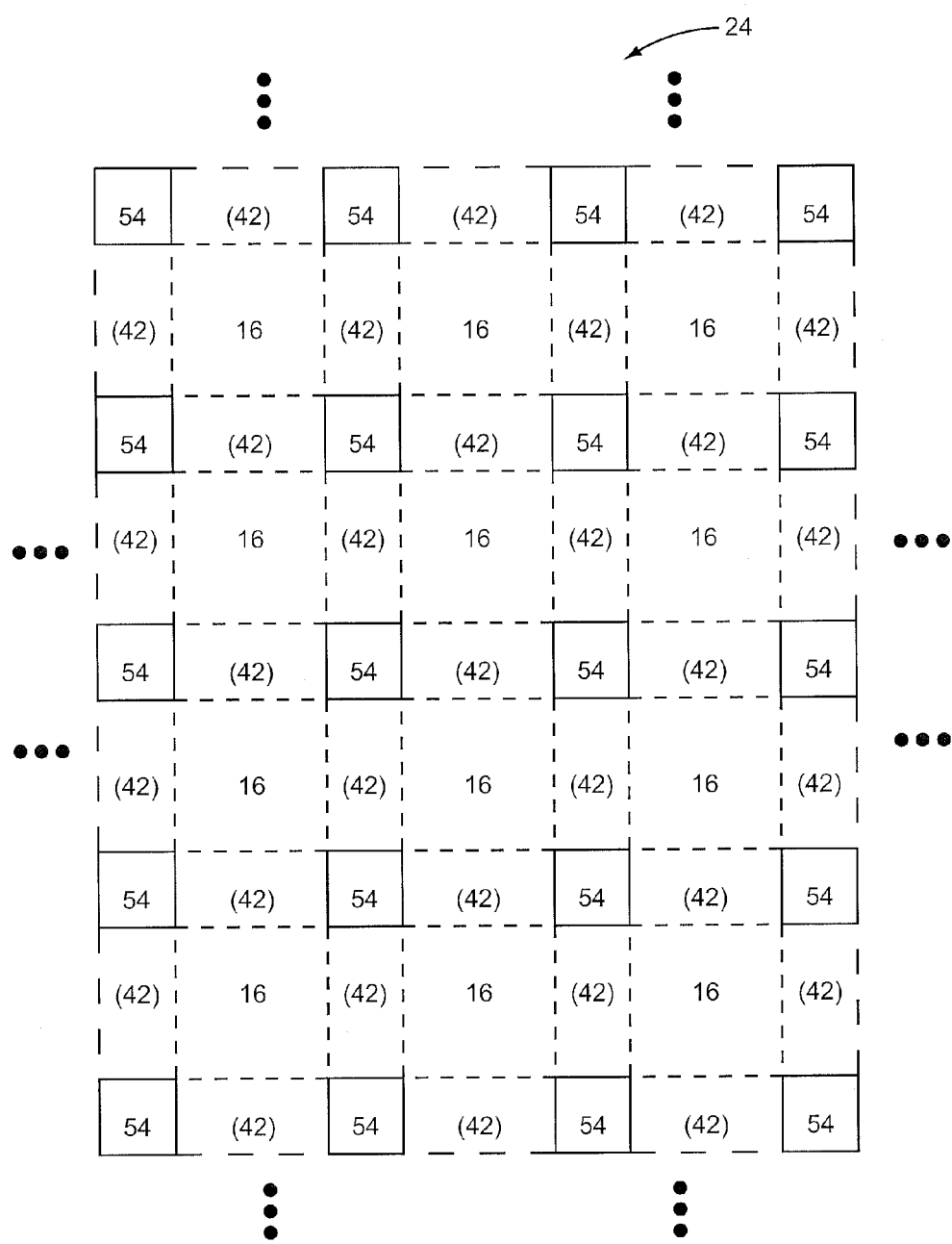
FIG. 21 illustrates the bottom surface of a laminate that includes support structures, such as those provided in FIG. 20.

In one embodiment of the present invention, support structures 54 are provided along the bottom surface of the laminate 12 at locations that are substantially underneath at least part of the openings 42, as illustrated in FIG. 20. The support structures 54 may take various forms, such as rails, pillars, or grids. As illustrated, the support structures 54 are formed of a metal layer 50' and a masking material 52', in the same fashion as that used to form metal layer 50 and masking material 52. The support structures 54 need not be continuously provided underneath the openings 42. For example, as illustrated in FIG. 21, the support structures 54 may be positioned at the junctions of openings 42 that form a grid. As illustrated, the trench-like openings 42 will intersect one another, and beneath the intersections of these trench-like openings 42 will lie a support structure 54 on the opposite (bottom) side of the laminate 12. Those skilled in the art will recognize various ways in which support structures 54 may be constructed.

The purpose of the support structure 54 is to provide a support mechanism to counter the downward forces that are applied to the laminate 12 during cutting and drilling operations. Providing the support structures 54 prevents or significantly reduces the extent that the laminate 12 flexes during the cutting and drilling processes, and as such, affords more consistent and precise cutting and drilling operations. As a result, the openings 42 are more consistent, such that less of the overmold material is left on those portions of the peripheral metallic structure that should be exposed, and at the same time, ensuring that those same portions of the peripheral metallic structure are not destroyed by cutting or drilling completely through them. Stabilization of the laminate 12 using the support structures 54 has proven to significantly reduce the number of rejects due to cutting or drilling too deeply, wherein the peripheral metallic structure is destroyed, or cutting or drilling too shallowly, wherein overmold material is left on the surface of the peripheral metallic structure.

Figure 22:
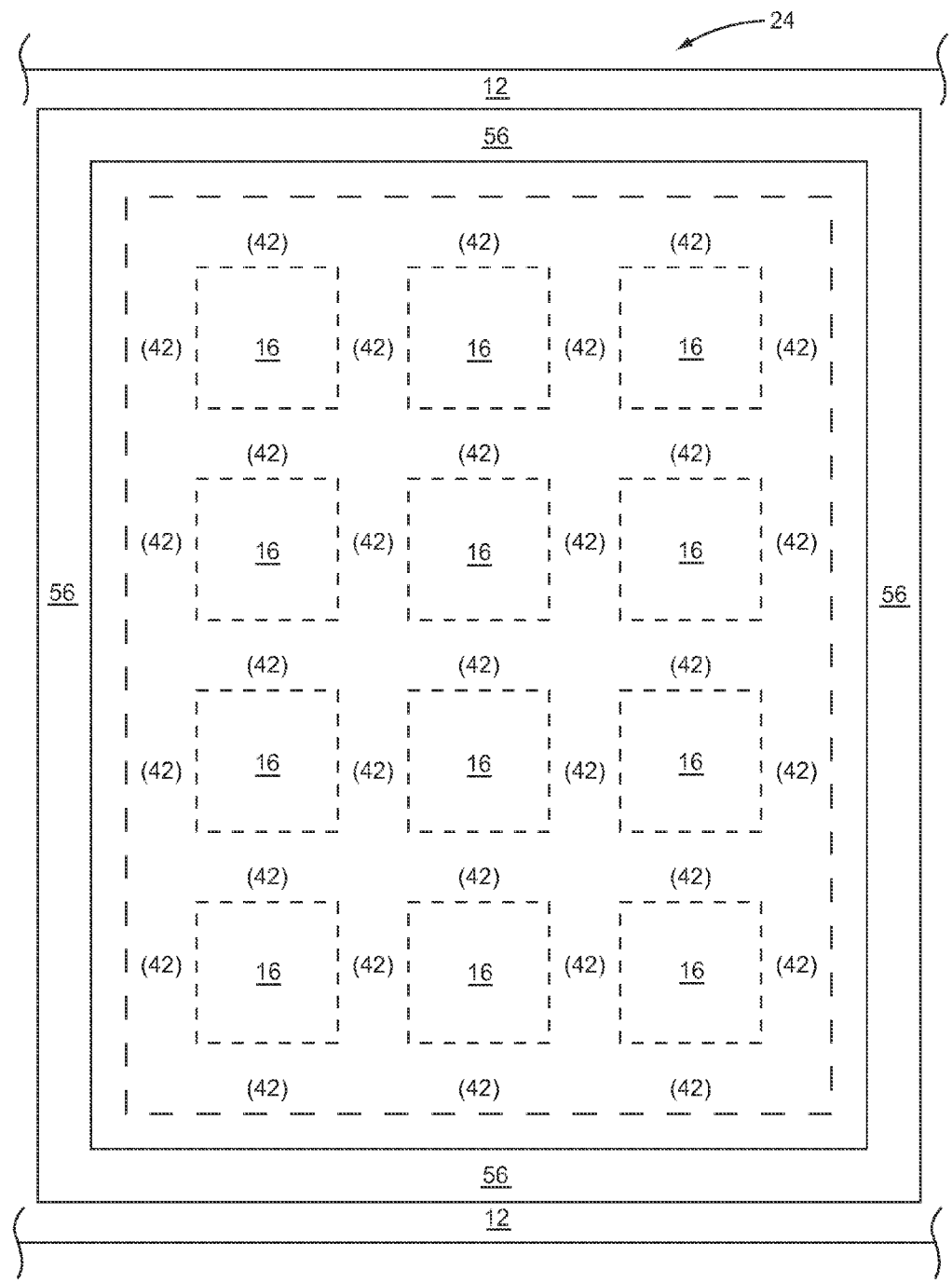
FIG. 22 illustrates the bottom surface of a laminate on which a seal ring structure is formed according to one embodiment of the present invention.
Figure 23:
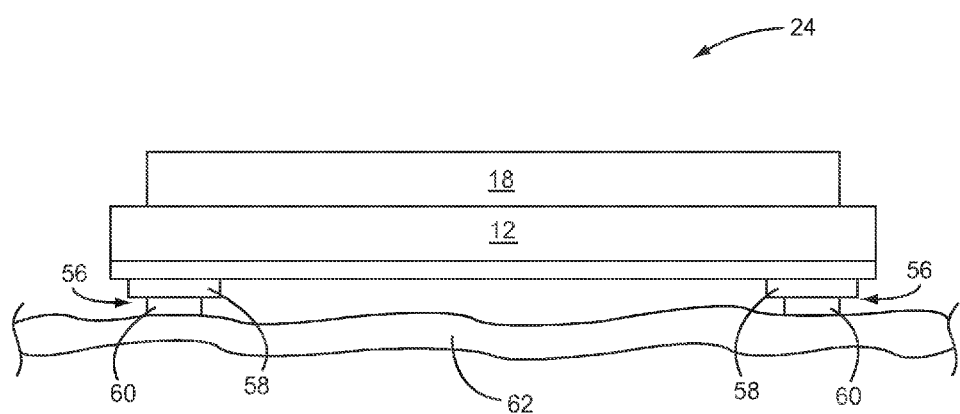
FIG. 23 illustrates the side view of a meta-module where a seal ring structure is provided on the bottom side of the laminate on which the meta-module is formed according to one embodiment of the present invention.

As noted, the laminate 12, and thus a meta-module 24, is carried on a processing platform during processing. For certain embodiments, it is beneficial to protect the bottom surface of the laminate 12, especially those portions corresponding to a sub-module 22 or module 10, from various gases or liquids, such as plasma etching and plating materials that are used to process the top surface of the meta-module 24. With reference to FIGS. 22 and 23, one embodiment of the invention incorporates a seal structure 56, which effectively provides a seal between the bottom surface of the laminate 12 and a top surface of a carrier media 62 on which the laminate 12 is carried during processing. The carrier media 62 may be a tape having an adhesive on its top surface. In a preferred embodiment, the seal structure 56 is provided at least in part by a metal ring 58 that is formed around an area to be protected on the bottom of the laminate 12.

As illustrated in FIG. 22, the seal structure 56 may be provided in association with each meta-module 24, and effectively provide a continuous ring about the outside periphery of the meta-module 24. In other words, the seal structure 56 will extend about an area on the bottom surface of the laminate 12 that corresponds to all of the component areas 16 for one or more meta-modules 24. The seal structure 56 may be made of the same material used to form the support structure 54. Regardless of material, the seal structure 56 may include a metal ring 58 formed on the bottom of the laminate 12, as illustrated in FIG. 23. The seal structure 56 may also include a masking material 60, such as a solder mask, that resides on the bottom surface of the metal ring 58. Whatever represents the bottom of the seal structure 56 will preferably be adhered to the top surface of the carrier media 62 sufficiently to prevent gases or liquids used during formation of the sub-modules 22 or modules 10 to substantially leak into the area beneath the laminate 12 and within the seal structure 56. This is particularly beneficial when numerous contact pads reside on the bottom surface of the laminate 12 and may be damaged, shorted, or the like if exposed to certain liquids or gases used during fabrication. The seal structure 56 need not form a complete ring. As an alternative, a spiral shape or substantially closed shape may suffice.

As noted above, caution should be taken to ensure that the portions of the peripheral metallic structure to be exposed are sufficiently exposed, yet not destroyed, during cutting or drilling processes to form the openings 42. In many embodiments, the metallic layer grid 14 used to form the peripheral metallic structures for the various sub-modules 22 or modules 10 may be relatively thin and formed from one of the upper metal layers of the laminate 12. As noted above, the support structures 54 may be used to maintain consistent cutting and drilling processes. In lieu of or in addition to the support structures 54, steps may be taken to increase the thickness of any metallic structure, including the peripheral metallic structures formed from the metallic layer grid 14 in an effort to reduce the precision necessary to cut or drill through the overmold body 18 to or into the peripheral metallic structure to be exposed, without drilling completely through the peripheral metallic structure.

Figure 24A:
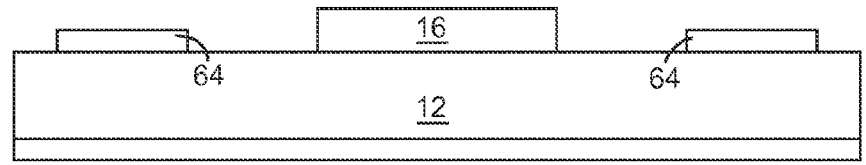
FIGS. 24A through 24E illustrate a process for providing an integrated electromagnetic shield where the metallic layer grid is built up in part using a plating process according to one embodiment of the present invention.
Figure 24B:
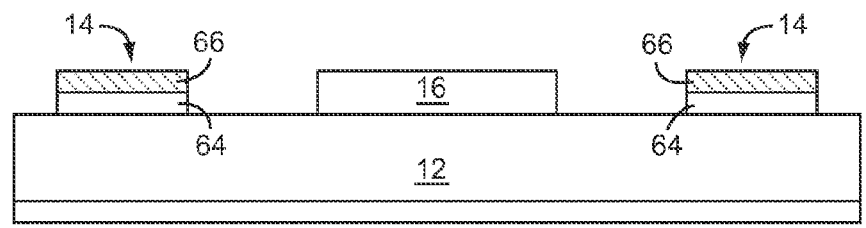
Figure 24C:
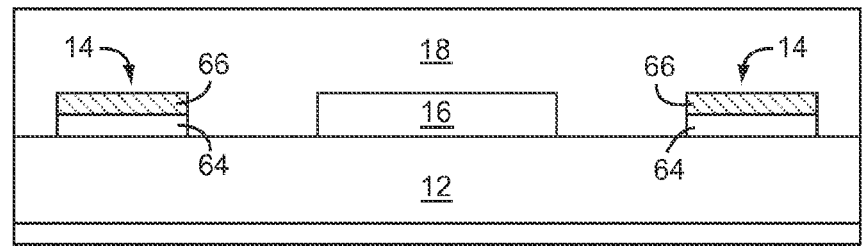
Figure 24D:
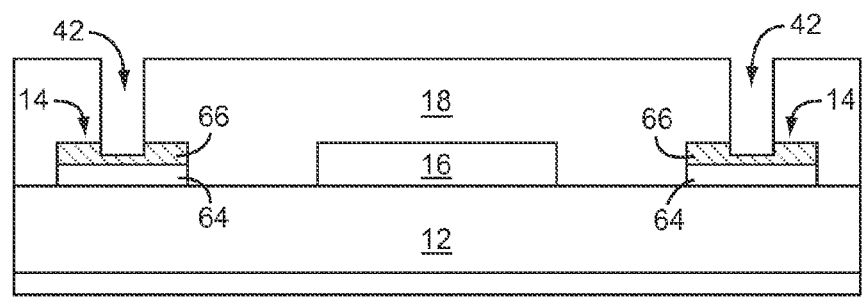

With reference to FIGS. 24A-24E, an exemplary technique is provided to effectively increase the thickness of the metallic layer grid 14, and thus minimize the precision necessary to effectively create the openings 42 through the overmold body 18 to the peripheral metallic structures of the metallic layer grid 14. Initially, a first metal grid 64 is formed from a top metal layer of the laminate 12 using an appropriate etching process, as illustrated in FIG. 24A. Subsequently, one or more plating layers 66 are formed on top of the first metal grid 64 to form the metallic layer grid 14 using appropriate masking and plating processes, as illustrated in FIG. 24B. As described above, the overmold body 18 is formed over the peripheral metallic structures, and openings 42 are cut or drilled to or into the peripheral metallic structures, as illustrated in FIGS. 24C and 24D, respectively.

Figure 24E:
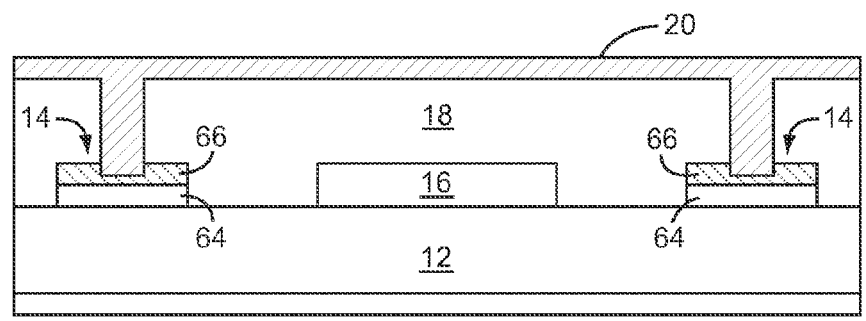

With the increased thickness of the metallic layer grid 14, the cutting or drilling process may be configured to err on drilling deeper into the metallic layer grid 14, without excessive concern for drilling completely through the metallic layer grid 14. After the openings 42 are formed, the electromagnetic shield 20 may be formed over the overmold body 18 and into the openings 42 to the exposed portion of the peripheral metallic structure provided by the metallic layer grid 14, as illustrated in FIG. 24E. Those skilled in the art will recognize various plating techniques to employ for providing the plating layer 66. As noted, multiple plating layers may be employed. Further, the same plating process used to form the electromagnetic shield 20 may be used to form the plating layer 66.

From the above, plating may be used to increase the relative thickness of the overall metallic structure, such that the cutting or drilling process is less likely to significantly damage the metallic structure. With the plating technique, a metallic plating layer is placed over a base metallic portion, which may reside on or in the laminate 12. This base metallic portion may be placed over additional metallic structures that are formed within the laminate 12. These metallic structures that are formed within the laminate 12 may include metallic vias, which are effectively holes extending into or through the laminate 12 that are subsequently filled with metal. As such, the metallic vias and the base metallic portion together form a metallic structure that can readily withstand the cutting or drilling process without adversely affecting shielding performance. Notably, other metallic structures may be placed beneath and in contact with the base metallic portion to effectively thicken the metallic structure to which the electromagnetic shield 20 is ultimately connected. These techniques, as well as the techniques that follow, may be employed regardless of the form or shape of the metallic structure. For example, these thickening techniques may be employed for peripheral metallic structures that are provided in part by the metallic layer grid 14, wherein the metallic layer grid 14 forms the base metallic portion. Accordingly, the metallic layer grid 14 may be plated, or alternatively, placed over and in contact with vias within the laminate 12.

Figure 25A:
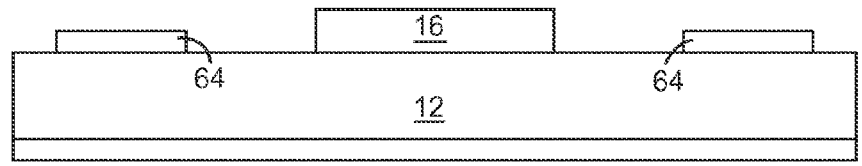
FIGS. 25A through 25E illustrate a process for providing an integrated electromagnetic shield where the metallic layer grid is built up in part using surface mount structures according to one embodiment of the present invention.
Figure 25B:
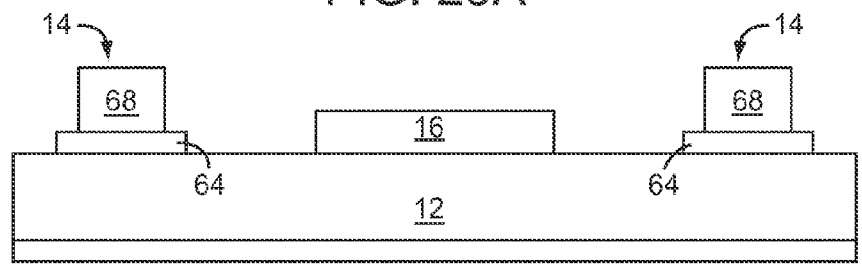
Figure 25C:
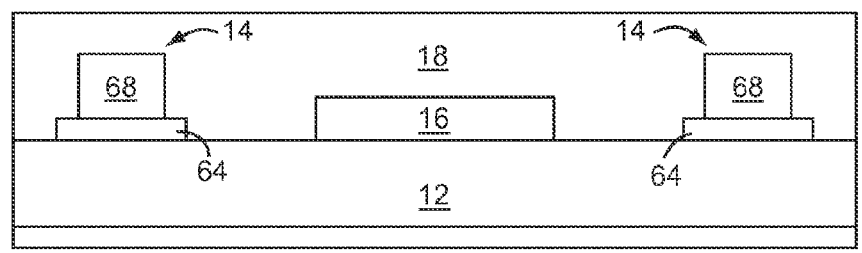
Figure 25D:
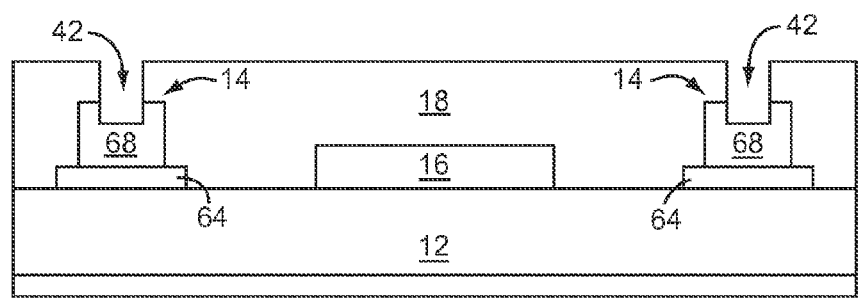
Figure 25E:
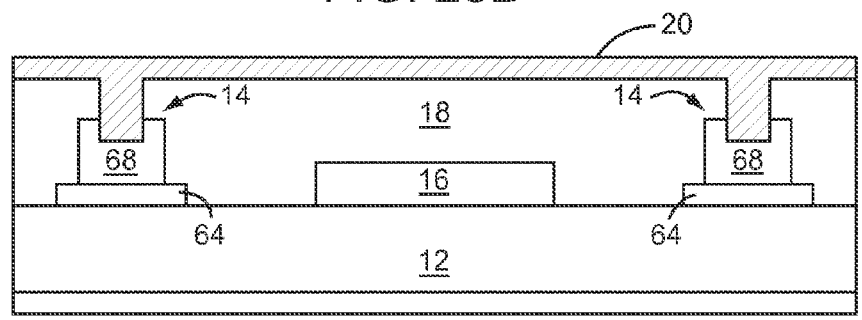

Plating and the use of vias are not the only techniques for increasing the thickness of the metallic layer grid 14. As illustrated in FIGS. 25A-25E, surface mount structures 68 may be placed on the first metal grid 64 during the same processing in which surface mount components are provided in the component areas 16. The surface mount structures 68 are preferably metallic and conductive. With reference to FIG. 25A, the first metal grid 64 is formed on the top surface of the laminate 12 as described above. During the surface mount process, the surface mount structures 68 are placed on the first metal grid 64, as illustrated in FIG. 25B, and then the overmold body 18 is applied, as illustrated in FIG. 25C. Notably, the surface mount structures 68 do not extend to the top of the overmold body 18. As such, a cutting or drilling process is employed to form the openings 42 that extend to or into the surface mount structures 68, as illustrated in FIG. 25D. The electromagnetic shield 20 is then formed over the overmold body 18 and to the exposed ones or portions of the surface mount structures 68 through the openings 42, as illustrated in FIG. 25E.

Figure 26A:
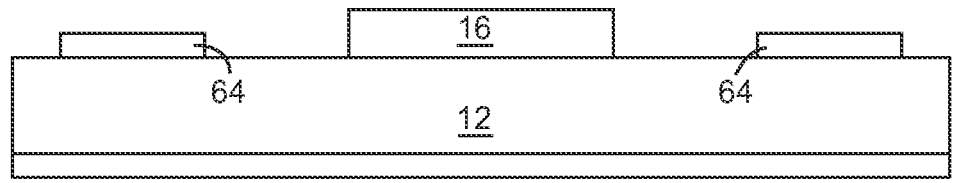
FIGS. 26A through 26D illustrate a process for providing an integrated electromagnetic shield where the metallic layer grid is built up in part using surface mount structures according to another embodiment of the present invention.
Figure 26B:
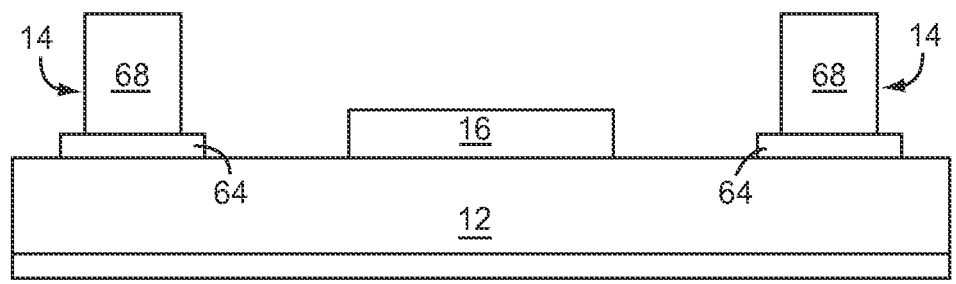
Figure 26C:
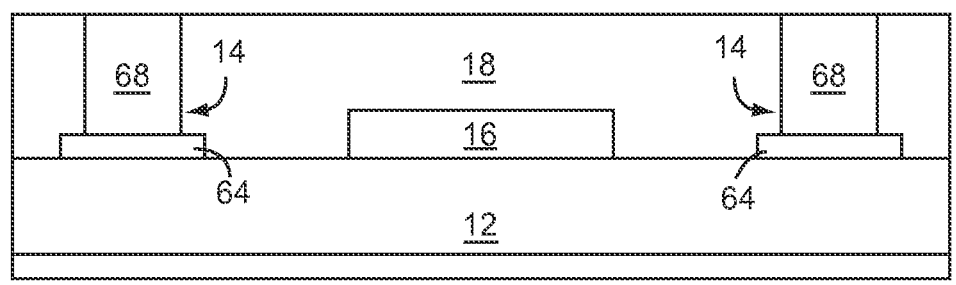
Figure 26D:
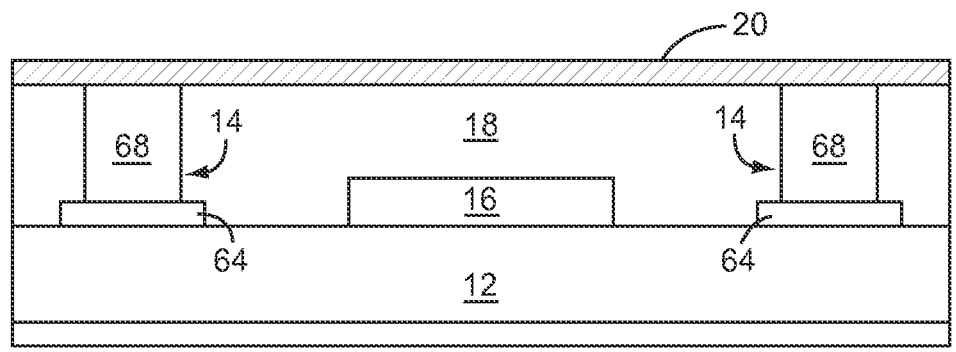

In an alternative embodiment, which is illustrated in FIGS. 26A-26D, the surface mount structures 68 may be sized such that the top surface of the surface mount structure 68 is flush with the top surface of the overmold body 18. Again, the first metal grid 64 is formed on the top surface of the laminate 12, as illustrated in FIG. 26A, and then the surface mount structures 68 are formed on the first metal grid 64 to form the metallic layer grid 14, as illustrated in FIG. 26B. When the overmold body 18 is applied in FIG. 26C, the surface mount structures 68 extend to the top surface of the overmold body 18 and are exposed. As such, there is no need for a cutting or drilling step to form an opening 42. In effect, the cutting or drilling process is eliminated, and the electromagnetic shield 20 may be formed along the top surface of the overmold body 18 and the surface mount structures 68, as illustrated in FIG. 26D. Although a surface mount structure 68 is illustrated, those skilled in the art will recognize that other plating or layering techniques may be used to effectively build the height of the metallic layer grid 14 to a point that will be flush with the top surface of the overmold body 18 in an effort to avoid the need to create the openings 42 extending to the top surface of the metallic layer grid 14 prior to forming the electromagnetic shield 20.

Figure 27A:
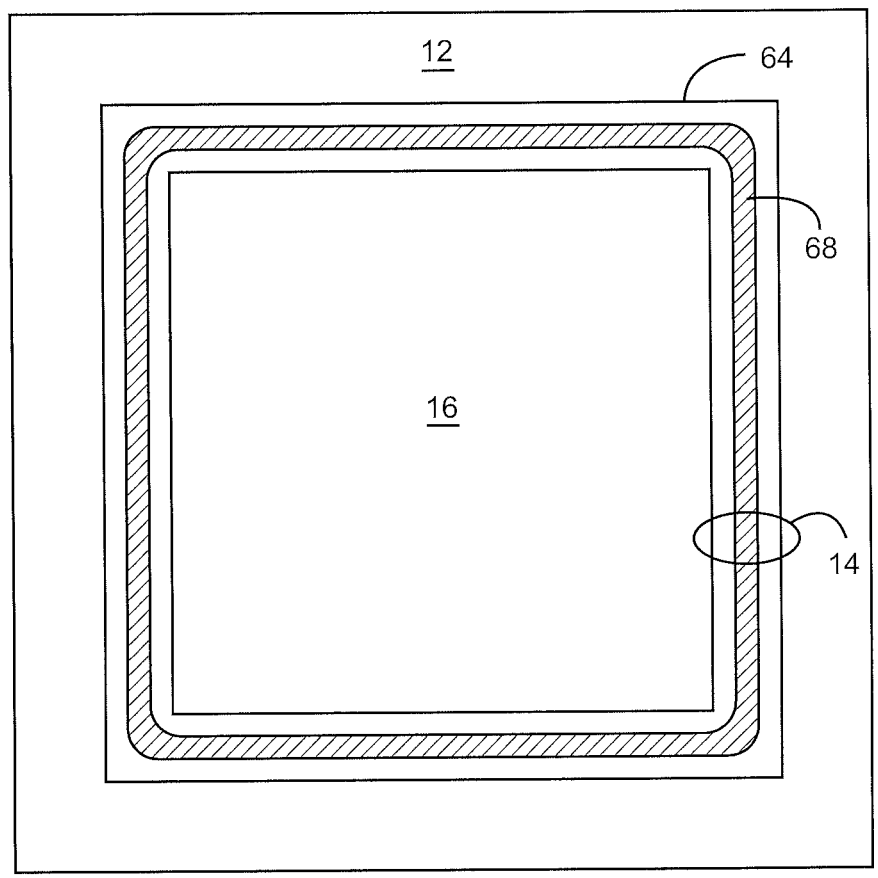
FIGS. 27A through 27C illustrate different configurations for the surface mount structures according to select embodiments of the present invention.
Figure 27B:
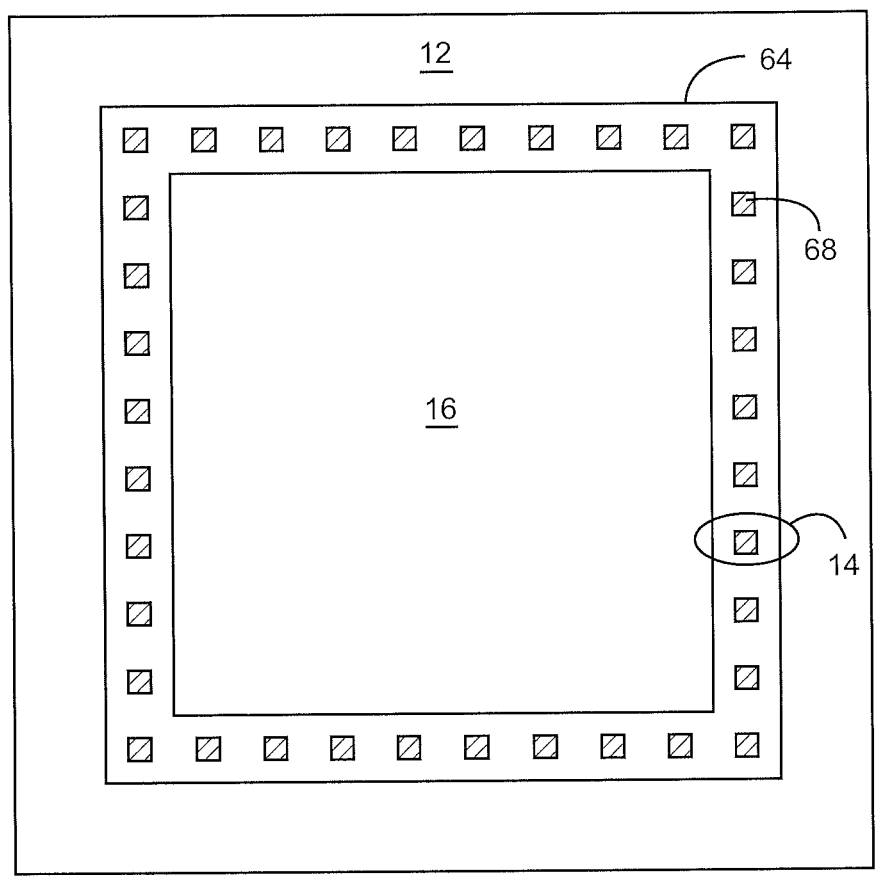
Figure 27C:
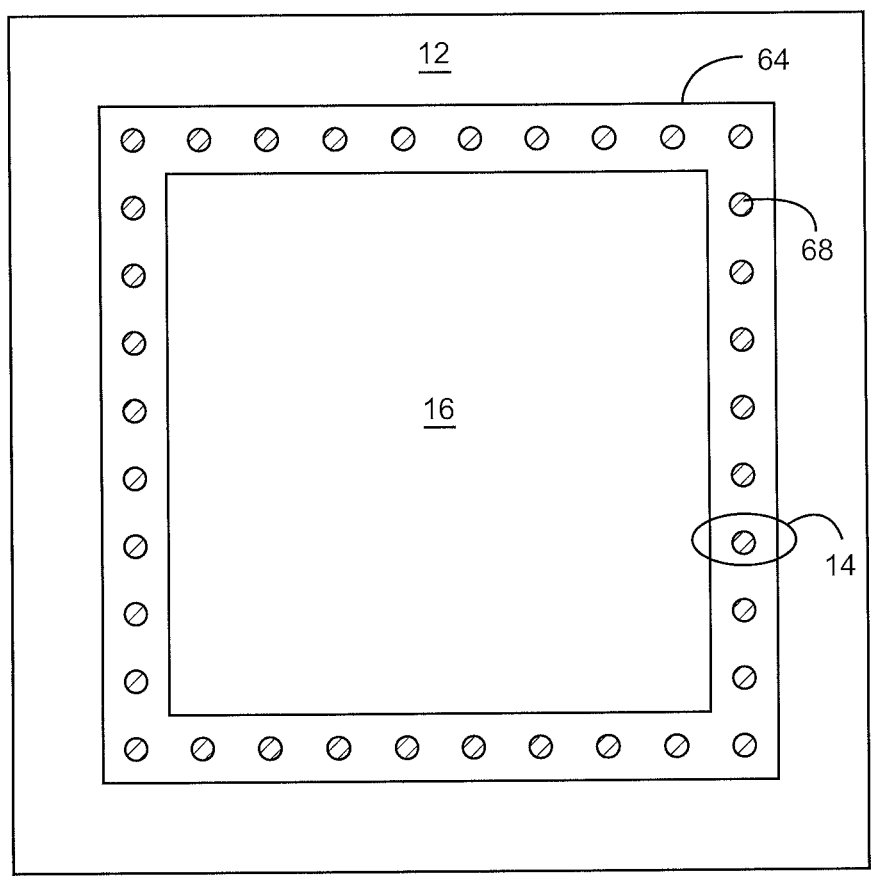

Regardless of the height of the surface mount structures 68, various structural configurations may be employed when building the enhanced-height metallic layer grid 14. With reference to FIG. 27A, the surface mount structure 68 may be a solid ring, which resides on a portion of the first metal grid 64 to form the metallic layer grid 14. Alternatively, and as illustrated in FIG. 27B, numerous surface mount structures 68 may be positioned on the first metal grid 64 to form the metallic layer grid 14. Although the first metal grid 64 is shown as being continuous, it may be created to correspond to the configurations of the surface mount structure or structures 68. In FIG. 27B, the surface mount structures 68 are shown to have a rectangular form factor, while those illustrated in FIG. 27C are shown to have a round or oval form factor. Further, metallic structures of any type may be applied in a similar fashion outside of a typical surface mount process.

Figure 28A:
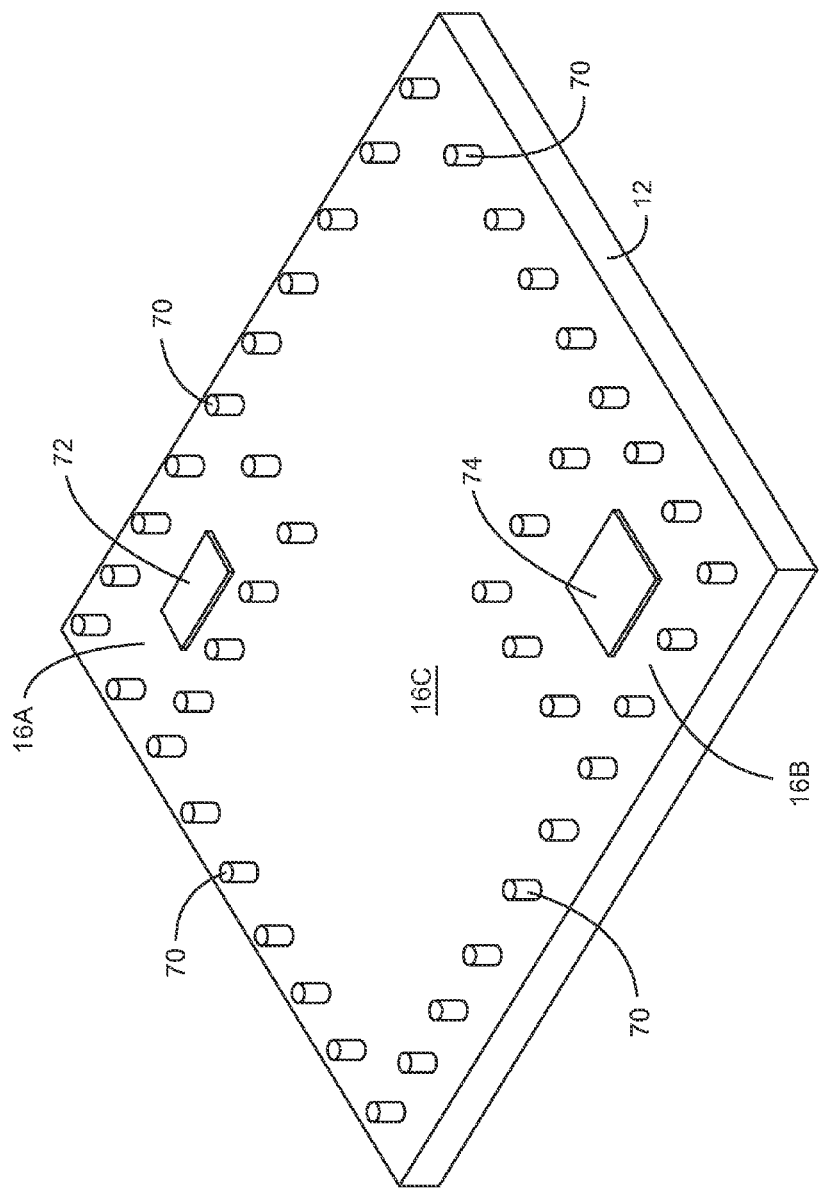
FIG. 28A illustrates a metallic layer grid formed from metallic studs on the top surface of the substrate according to one embodiment of the present invention.

With the above embodiments, the metallic layer grid 14 may be a multi-component structure. Further, in many of these embodiments, the base structure was the first metal grid 64, which may be continuous or discontinuous about the component areas 16 to be shielded. An alternative to these embodiments is provided in FIG. 28A. As illustrated, the metallic layer grid 14, which is not specifically referenced, is formed from a collection of metallic studs 70, which are formed or placed along the top surface of the laminate 12. FIG. 28A illustrates a single module 10 having three component areas 16A, 16B, and 16C; however, those skilled in the art will recognize that the arrangement of the metallic studs 70 about the overall periphery of the illustrated laminate 12 as well as about the component areas 16A and 16B, may be repeated in a grid-like fashion throughout a corresponding meta-module 24 for the different modules 10. In this example, components 72 and 74 are illustrated as being in component areas 16A and 16B, respectively. Although not illustrated, component area 16C may also include electronic components. During the cutting or drilling process to expose the metallic layer grid 14 through the overmold body 18, trenches or holes are cut through the overmold body 18 to or into the metallic studs 70 to be exposed. In essence, these metallic studs 70 form the peripheral metallic structure that surrounds one or more component areas 16A, 16B, 16C. Component areas 16A, 16B, 16C may each have its own electromagnetic shield 20. Notably, the metal studs 70 are formed directly on the laminate 12, and not on a metal trace or layer, such as the first metal grid 64. Instead, traces or vias within the laminate 12 may be used to connect all or select ones of the metallic studs 70 to an appropriate node, such as a ground plane, for shielding purposes.

Figure 28B:
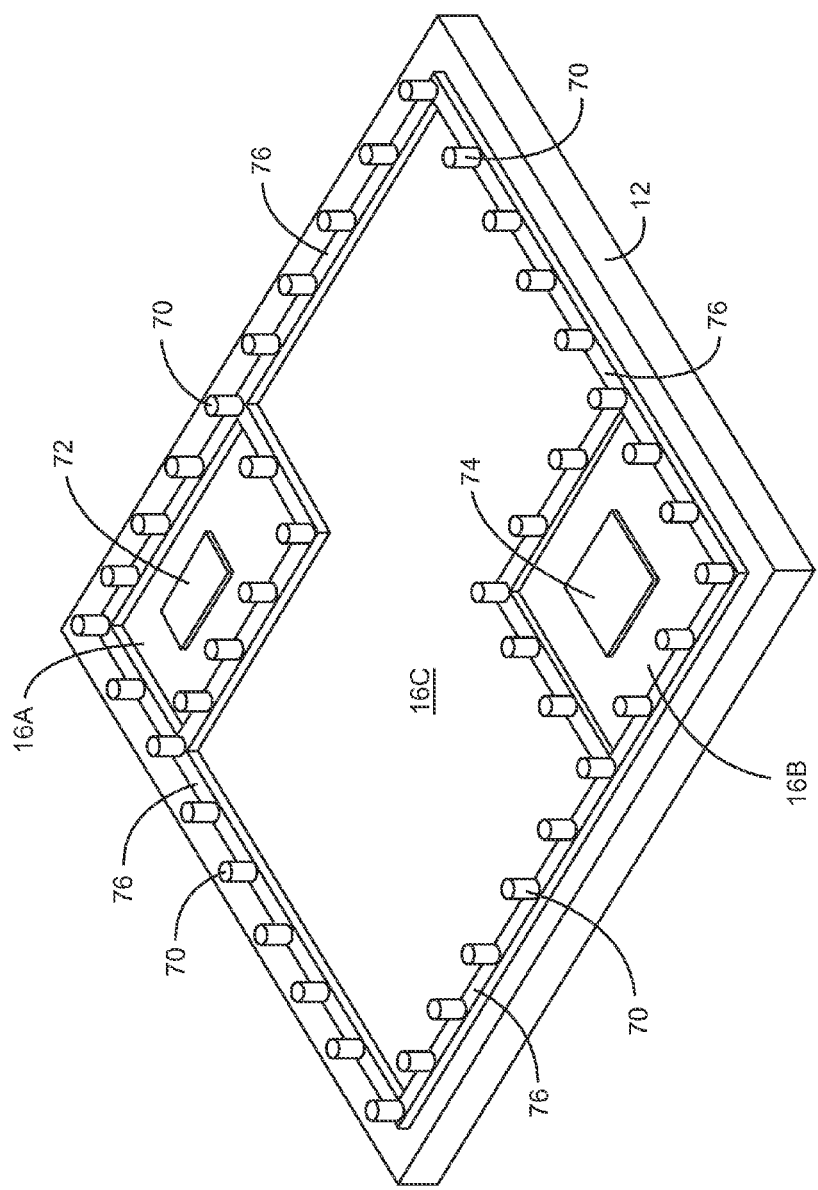
FIG. 28B illustrates a metallic layer grid formed from metallic studs on a metal trace that resides on the top surface of the substrate according to one embodiment of the present invention.

With reference to FIG. 28B, metallic studs 70 are again used to provide the metallic layer grid 14. However, the metallic studs 70 are placed on a peripheral metal trace 76. As such, various points along the metal trace 76 may be connected through additional traces or vias to a node, such as a ground plane, for shielding purposes. In this embodiment, the metallic layer grid 14 will include the metal traces 76 for multiple modules 10 and the metallic studs 70 that reside thereon. The cutting or drilling process employed to expose the metallic layer grid 14 is configured to cut or drill to or into the metallic studs 70 that are to be exposed. In either of the embodiments illustrated in FIG. 28A or 28B, once the selected metallic studs 70 are exposed through the overmold body 18, the electromagnetic shield 20 may be applied over the overmold body 18 and into the openings 42 to the exposed metallic studs 70. From the above, those skilled in the art will recognize various ways in which to implement the metallic grid layer 14, and thus the peripheral metallic structures that are formed about all or a portion of the component area 16 to be shielded according to the present invention.

Notably, any metallic structure for a component area 16 may be continuous or segmented along one or more sides of the component area 16. These metallic structures need not extend completely or even substantially about a periphery of a component area 16. However, better shielding performance is generally associated with more contact with more extensive peripheral metallic structures.

Figure 29A:
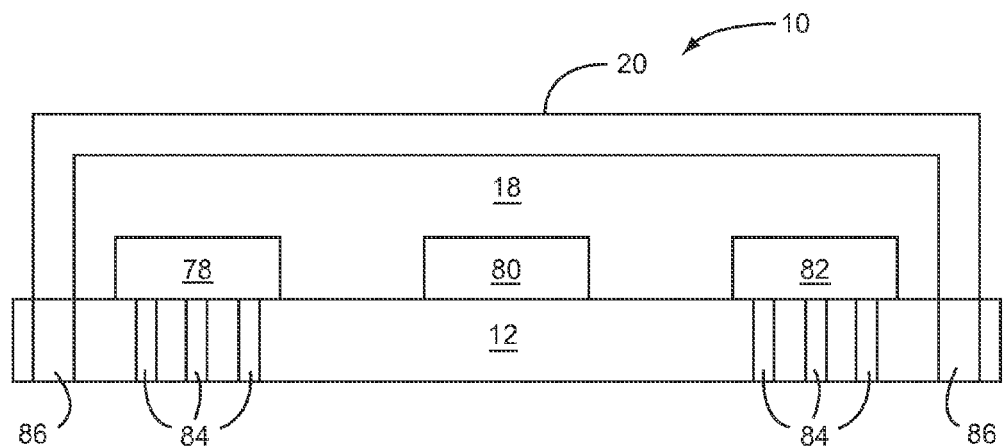
FIG. 29A illustrates a cross-section of a module in which an integrated electromagnetic shield is provided according to one embodiment of the present invention.

The shielding techniques of the present invention may be extended to provide functionality in addition to electromagnetic shielding. For example, various components residing in a component area 16 may be thermally connected to the electromagnetic shield 20, wherein the electromagnetic shield 20 will provide a thermal path to a defined location or act as a heat sink itself. With reference to FIG. 29A, a module 10 is provided with an electromagnetic shield 20 according to one embodiment of the present invention. As illustrated, a component area 16 (not referenced) includes three electronic components 78, 80, and 82. The electronic components 78 and 82 reside over and are electrically and thermally coupled to multiple thermal vias 84, which are configured to dissipate heat away from the electronic components 78 and 82 through the laminate 12 to a structure on which the module 10 will ultimately be mounted. For this example, assume that electronic component 80 does not need such thermal vias 84. Also illustrated in FIG. 29A is an electromagnetic shield 20, which extends over the overmold body 18 and down to shielding vias 86, which are generally coupled to a ground plane within the laminate 12 or on the structure to which the module 10 will ultimately be mounted. In this embodiment, the electromagnetic shield 20 will generally not assist in dissipating heat generated by the electronic components 78, 80, 82.

Figure 29B:
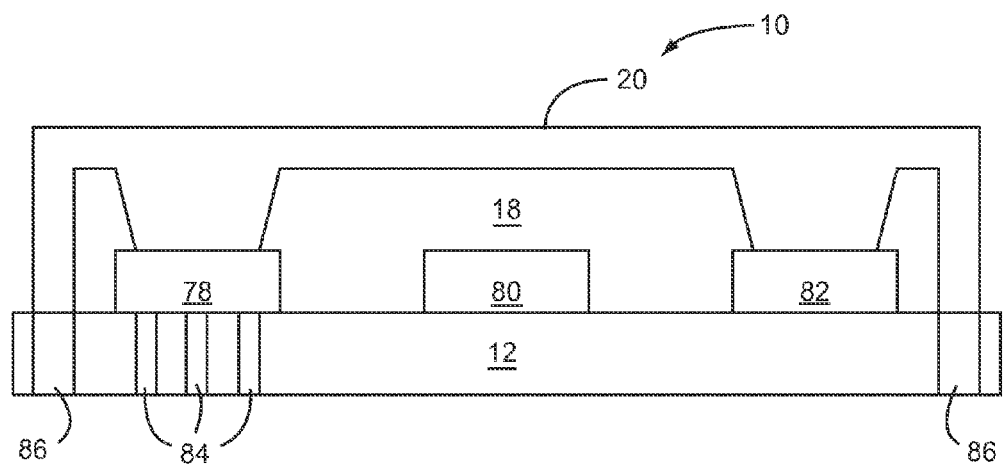
FIGS. 29B through 29D illustrate cross-sections of different modules in which the integrated electromagnetic shield is also configured to act as a thermal path or heat sink according to one embodiment of the present invention.

With reference to FIG. 29B, the module 10 that was illustrated in FIG. 29A has been modified such that the electromagnetic shield 20 is thermally, and perhaps electrically, coupled to the electronic components 78 and 82. In this embodiment, significant portions of the overmold body 18 are exposed such that application of the electromagnetic shield 20 will result in the electromagnetic shield 20 extending to the top surfaces of the electronic components 78 and 82. Electronic component 82 relies primarily on the electromagnetic shield 20 for heat dissipation, as the associated thermal vias 84 are not present. However, thermal vias 84 are provided for the electronic component 78. As such, electronic component 78 may take advantage of thermal vias 84 and the electromagnetic shield 20 to dissipate heat from both sides of the electronic component 78. The heat dissipated through the electromagnetic shield 20 may be primarily dissipated through the primary structure of the electromagnetic shield 20 or passed back through the laminate 12 through the shielding vias 86. In either case, the shielding vias 86 may also provide an electrical path to ground for the electromagnetic shield 20, and perhaps the electronic component 78 as well.

Those skilled in the art will recognize the various options for using the electromagnetic shield 20 for thermal and electrical conduction. Formation of the openings above the electronic components 78 and 82 may be provided by cutting or drilling through the overmold body 18, after the overmold body 18 has been applied. As such, the techniques used to provide the openings 42 may be used to remove the portion of the overmold body 18 above the electronic components 78 and 82. Alternatively, masking techniques may be employed to prevent the overmold body 18 from being formed over these electronic components 78 and 82.

Figure 29C:
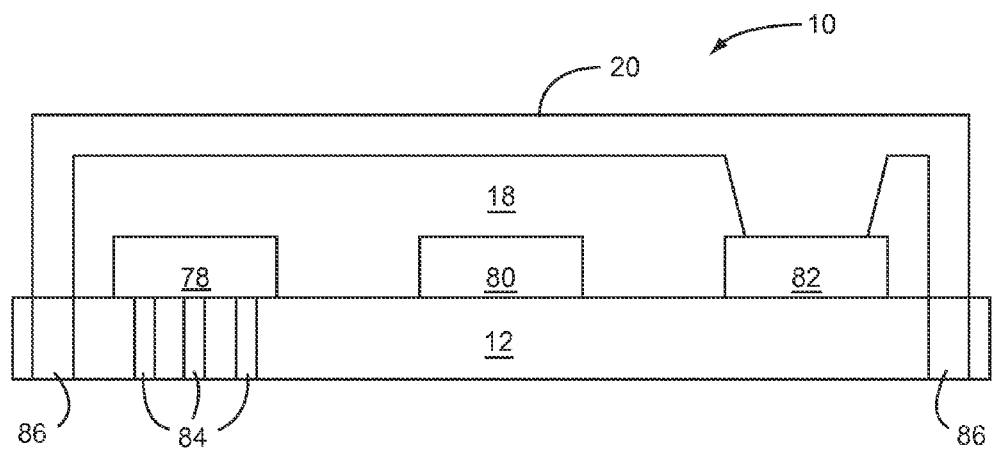

The module 10 as illustrated in FIG. 29C is substantially similar to that illustrated in FIG. 29B, with the exception that the electromagnetic shield 20 does not extend to the electronic component 78. Instead, the electromagnetic shield 20 only extends to the electronic component 82. The thermal vias 84 are only used in association with the electronic component 78, and not the electronic component 82. Accordingly, different electronic components 78 and 82 may employ different thermal paths for heat dissipation, where at least one of the thermal paths includes the electromagnetic shield 20, which is also used for electromagnetic shielding. Again, the electromagnetic shield 20 may also provide an electrical path to ground or other node for the electronic component 82.

Figure 29D:
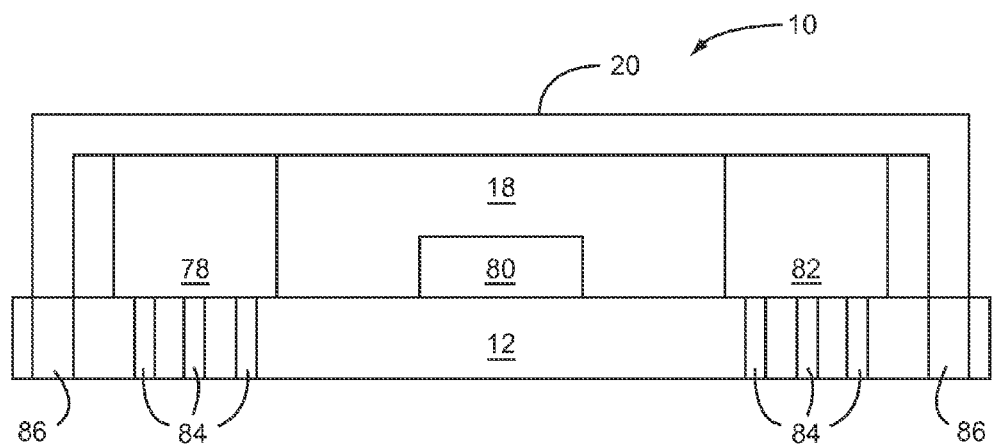

In FIGS. 29B and 29C, the portions of the electromagnetic shield 20 that reside over the electronic components 78 and 82 extend through the overmold body 18 to the electronic components 78 and 82. The electronic components 78 and 82 do not extend above the laminate 12 as far as the overmold body 18 extends above the laminate 12. As a result, openings must be provided above the electronic components 78 and 82 in which the electromagnetic shield 20 extends downward to the electronic components 78 and 82. In an alternative embodiment such as that illustrated in FIG. 29D, the electronic components 78 and 82 may be of the same height as the overmold body 18, such that they extend above the laminate 12 to the same extent as the overmold body 18. Accordingly, the electronic components 78 and 82 do not require openings above them within the overmold body 18 to come into contact with the electromagnetic shield 20. If the electronic components 78 and 82 are not the same height as the resulting overmold body 18, various techniques may be used to effectively extend the height of the electronic components 78 and 82 with thermally conductive material to ensure contact with the electromagnetic shield 20.

In many instances, circuitry within a shielded area may generate electromagnetic fields that impact other circuitry within the same shielded area. When the circuitry creating the electromagnetic fields cannot be separately shielded from circuitry that is sensitive to electromagnetic fields, the overall performance of the circuitry is negatively impacted. In one embodiment of the present invention, field barrier structures 88 are formed inside the electromagnetic shield 20 in an effort to attenuate electromagnetic fields that occur inside the electromagnetic shield 20, as illustrated in FIG. 30A. The field barrier structures 88 may take on various shapes or forms, but will preferably extend downward from the electromagnetic shield 20 to or toward the laminate 12 through the overmold body 18 and perhaps any circuitry residing in the component areas 16. As illustrated, the field barrier structures 88 extend all the way from the electromagnetic shield 20 to the laminate 12, and in particular to field barrier vias 90. The field barrier vias 90 are coupled to the field barrier structures 88 directly or via an appropriate trace, and extend through all or a portion of the laminate 12 to a ground plane 92, which is illustrated in the middle of the laminate 12, but may reside anywhere within the laminate 12 or on the bottom surface of the laminate 12. Notably, shield vias 94 may extend between the ground plane 92 and the metallic layer grid 14, which provides the exposed portion of the metallic layer structure. Accordingly, the electromagnetic shield 20 may be connected to the ground plane 92 through the metallic layer grid 14 and the shield vias 94, while the field barrier structures 88 are connected to the ground plane 92 either through the field barrier vias 90 or through the electromagnetic shield 20, the metallic layer grid 14, and the shield vias 94. Notably, if the field barrier structures 88 do not extend all the way to the laminate 12, an electrical connection to the electromagnetic shield 20 is provided through the metallic layer grid 14 and the shield vias 94 to the ground plane 92.

With reference to FIG. 30B, the field barrier structures 88 may be provided anywhere within the component area 16 of the module 10. In the illustrated embodiment, electronic components 96A, 96B, and 96C reside in the component area 16 and cylindrical field barrier structures 88 are positioned in a staggered manner within the component area 16. The dashed lines in FIG. 30B represent elements residing under the continuous electromagnetic shield 20 that covers most, if not all, of the module 10 in the illustrated embodiment.

Although FIGS. 30A and 30B illustrate substantially cylindrical configurations of the field barrier structures 88, those skilled in the art will recognize that the field barrier structures 88 may take virtually any shape that may be oriented among the electronic components 96A, 96B, 96C and reside within the component area 16, which is covered by the electromagnetic shield 20. For example, the field barrier structures 88 may form straight, angled, or curved walls or like elements within the electromagnetic shield 20. Again, the field barrier structures 88 may, but need not, extend completely between the electromagnetic shield 20 to the top surface of the laminate 12. The field barrier structures 88 may also extend from the electromagnetic shield 20 through the overmold body 18 into contact with a top portion of an electronic component 96A, 96B, 96C or simply to a point over these components or the surface of the laminate 12, without coming into contact with anything other than the overmold body 18 and the electromagnetic shield 20.

In one embodiment, the field barrier structures 88 are integrally formed along with the electromagnetic shield 20. In particular, prior to applying the electromagnetic shield 20, openings (not referenced) for the field barrier structures 88 are formed within the overmold body 18 when portions of the metallic layer grid 14 are being exposed. Preferably, the same cutting or drilling process used to expose the peripheral metallic structure of the metallic layer grid 14 is used to create the openings for the field barrier structures 88. After any cleaning or roughening steps, the spraying or plating processes for applying the electromagnetic shield material for the electromagnetic shield 20 will also operate to line or fill the openings to create the field barrier structures 88 along with creating the electromagnetic shield 20. As such, the field barrier structures 88 and the electromagnetic shield 20 may form a single uniform structure, wherein the field barrier structures 88 are electrically, thermally, and physically connected to the electromagnetic shield 20. However, the field barrier structures 88 need not be formed using the same process or at the same time as the electromagnetic shield 20. Different processes and different materials may be used to form the field barrier structures 88 and the electromagnetic shield 20.

Preferably, the field barrier structures 88 are positioned over or within the component area 16 in such a way as to attenuate electromagnetic fields emanating from one or more of the electronic components 96A, 96B, 96C. Simulation or experimentation may be used for given embodiments, to determine the position, shape, orientation, and number of field barrier structures 88 to achieve desired operational characteristics.

Those skilled in the art will recognize improvements and modifications to the preferred embodiments of the present invention. All such improvements and modifications are considered within the scope of the concepts disclosed herein and the claims that follow. In the claims, use of the term "certain" in association with members of a group shall mean at least one of the members of the group. All members of the group may, but need not be, considered "certain" members. Further, wherein a plurality of members of a group has a plurality of elements, only certain members need to have at least one element. Although acceptable, each of the certain members need not have more than one element.

What is claimed is:

1. A meta-module comprising:
a substrate;
a ground plane located inside of the substrate or located on a bottom surface of the substrate;
a component area located on a top surface of the substrate, wherein the component area includes a first electronic component and a second electronic component;
a metallic layer grid located on the top surface of the substrate and substantially surrounding the component area;

a dielectric body substantially covering the component area;

an electromagnetic shield substantially covering the dielectric body, and in electrical communication with the metallic layer grid;

a shield via electrically connecting the metallic layer grid to the ground plane through the substrate, such that the electromagnetic shield, the metallic layer grid, the shield via, and the ground plane are all in electrical communication with each other;

a first field barrier structure, wherein the first field barrier structure begins at an upper portion of the electromagnetic shield, extends downward through the dielectric body, and extends further downward through the component area, such that the first field barrier structure is in electrical communication with the electromagnetic shield, the metallic layer grid, the shield via, and the ground plane, and wherein the first field barrier structure is configured to reduce electromagnetic interference between the first electrical component and the second electronic component.

2. The meta-module of claim 1, further comprising:
a first field barrier structure via located inside of the substrate and electrically connecting the ground plane with the first field barrier structure.

3. The meta-module of claim 1, wherein a lower surface of the first field barrier structure terminates on the top surface of the substrate, and wherein the first field barrier structure is in electrical communication with the ground plane only through a path including the electromagnetic shield, the metallic layer grid, and the shield via.

4. The meta-module of claim 1, further comprising:
a second field barrier structure; and
a third electronic component, and
wherein the first field barrier structure is located adjacent to the first electronic component and to the second electronic component, such that the first field barrier structure reduces electromagnetic interference between the first electronic component and the second electronic component, and
wherein the second field barrier structure is located adjacent to the second electronic component and to the third electronic component, such that the second field barrier structure reduces electromagnetic interference between the second electronic component and the third electronic component.

5. The meta-module of claim 1, wherein the second electronic component is substantially rectangular, and wherein the first field barrier structure and the second field barrier structure are located diagonally across from each other relative to the second electronic component.

6. The meta-module of claim 5, further comprising additional electronic components and additional field barrier structures, wherein the field barrier structures are staggered between the electronic components.

7. The meta-module of claim 1, wherein the field barrier structure is cylindrically shaped.

8. The meta-module of claim 1, wherein the field barrier structure is shaped like a wall.

9. The meta-module of claim 1, wherein the first field barrier structure is located between a first wall of the first electronic component and a first wall of the second electronic component.

* * * * *